(12) United States Patent
Riedel et al.

(10) Patent No.: US 9,941,486 B2
(45) Date of Patent: Apr. 10, 2018

(54) COMPONENT AND METHOD FOR PRODUCING A COMPONENT

(71) Applicant: OSRAM OLED GmbH, Regensburg (DE)

(72) Inventors: Daniel Riedel, Regensburg (DE); Johannes Rosenberger, Regensburg (DE); Thomas Wehlus, Lappersdorf (DE); Nina Riegel, Tegernheim (DE); Silke Scharner, Regensburg (DE); Arne Fleissner, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 4 days.

(21) Appl. No.: 15/022,992

(22) PCT Filed: Sep. 18, 2014

(86) PCT No.: PCT/EP2014/069877
§ 371 (c)(1),
(2) Date: Mar. 18, 2016

(87) PCT Pub. No.: WO2015/040104
PCT Pub. Date: Mar. 26, 2015

(65) Prior Publication Data
US 2016/0233455 A1    Aug. 11, 2016

(30) Foreign Application Priority Data
Sep. 20, 2013   (DE) .................. 10 2013 110 449

(51) Int. Cl.
*H01L 51/52* (2006.01)
*H01L 21/66* (2006.01)
(Continued)

(52) U.S. Cl.
CPC .......... *H01L 51/5268* (2013.01); *H01L 22/20* (2013.01); *H01L 51/5203* (2013.01);
(Continued)

(58) Field of Classification Search
CPC ....................................... H01L 22/20
See application file for complete search history.

(56) References Cited

U.S. PATENT DOCUMENTS

2008/0093978 A1    4/2008   Mori
2010/0150513 A1    6/2010   Zhang et al.
(Continued)

FOREIGN PATENT DOCUMENTS

DE    112006001268 T5    4/2008
DE    102011079797 A1    1/2013
(Continued)

OTHER PUBLICATIONS

German Search Report based on Application No. 10 2013 110 449.5 (7 Pages) dated Aug. 19, 2014 (Reference Purpose Only).
(Continued)

*Primary Examiner* — Fernando L Toledo
*Assistant Examiner* — Valerie N Newton
(74) *Attorney, Agent, or Firm* — Viering, Jentschura & Partner mbB

(57) ABSTRACT

Various embodiments may relate to a component. The component includes an optically active region designed for electrically controllably transmitting, reflecting, absorbing, emitting and/or converting an electromagnetic radiation, and an optically inactive region formed alongside the optically active region, wherein the optically inactive region and/or the optically active region have/has an adaptation structure designed to adapt the value of an optical variable in the optically inactive region to a value of the optical variable in the optically active region.

11 Claims, 13 Drawing Sheets

(51) Int. Cl.
　　　*H01L 51/56*　　　(2006.01)
　　　*H01L 51/44*　　　(2006.01)

(52) U.S. Cl.
　　　CPC ...... *H01L 51/5246* (2013.01); *H01L 51/5253* (2013.01); *H01L 51/5281* (2013.01); *H01L 51/56* (2013.01); *H01L 51/441* (2013.01); *H01L 2251/308* (2013.01); *H01L 2251/5361* (2013.01)

(56) References Cited

U.S. PATENT DOCUMENTS

| | | | | |
|---|---|---|---|---|
| 2012/0007134 A1* | 1/2012 | Miyai | ................ | H01L 51/5203 257/99 |
| 2014/0097424 A1* | 4/2014 | Miyai | ................ | H01L 51/5203 257/40 |

FOREIGN PATENT DOCUMENTS

| | | |
|---|---|---|
| EP | 2403317 A1 | 1/2012 |
| WO | 2006123126 A1 | 11/2006 |

OTHER PUBLICATIONS

International Search Report based on Application No. PCT/EP2014/069877 (3 Pages and 3 Pages of English Translation) dated Jan. 7, 2015 (Reference Purpose Only).

\* cited by examiner

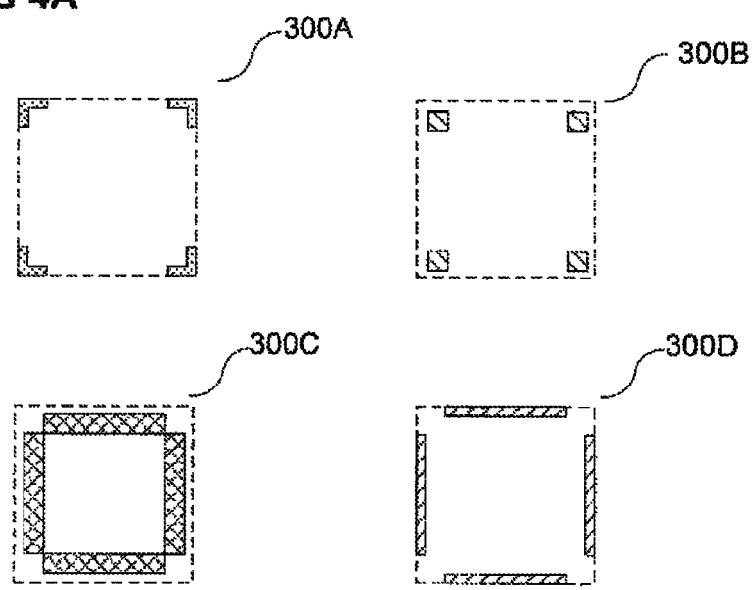
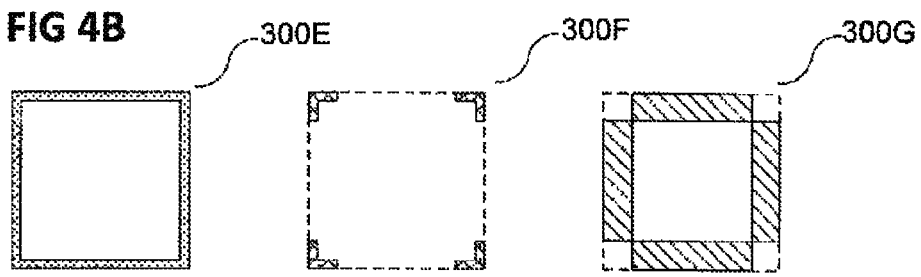

FIG 9

| Decrease in luminance at approx. 2000cd/m² | Conductivity S*sq | Resistance Ohm/sq | Uniformity | min unit: cd/m² | Difference with respect to reference | max unit: cd/m² | Difference with respect to reference |
|---|---|---|---|---|---|---|---|
| | 0.0667 | 14.9925 | 0.9263 | 1549.5 | 0.778 | 1795.1 | 0.768 |
| | 0.1667 | 5.5988 | 0.9234 | 1762.1 | 0.885 | 2054.6 | 0.879 |
| | 0.2667 | 3.7495 | 0.9221 | 1832.8 | 0.921 | 2142.5 | 0.917 |
| | 0.3667 | 2.7270 | 0.9215 | 1869.2 | 0.939 | 2187.9 | 0.936 |
| 5% | 0.4667 | 2.1427 | 0.9211 | 1891.8 | 0.950 | 2215.9 | 0.948 |
| | 0.5667 | 1.7646 | 0.9208 | 1907.2 | 0.958 | 2235.1 | 0.956 |
| | 0.6667 | 1.4999 | 0.9207 | 1918.4 | 0.964 | 2249.0 | 0.962 |
| | 0.7667 | 1.3043 | 0.9206 | 1927.0 | 0.968 | 2259.6 | 0.967 |
| | 0.8667 | 1.1538 | 0.9205 | 1933.8 | 0.972 | 2268.0 | 0.970 |
| | 0.9667 | 1.0344 | 0.9204 | 1939.3 | 0.974 | 2274.8 | 0.973 |
| | 1.0667 | 0.9375 | 0.9203 | 1943.9 | 0.977 | 2280.4 | 0.976 |
| | 1.1667 | 0.8571 | 0.9203 | 1947.7 | 0.979 | 2285.1 | 0.978 |
| 2% | 1.2667 | 0.7895 | 0.9202 | 1951.0 | 0.980 | 2289.2 | 0.979 |
| | 1.3667 | 0.7317 | 0.9202 | 1953.9 | 0.982 | 2292.7 | 0.981 |
| | 1.4667 | 0.6818 | 0.9202 | 1956.3 | 0.983 | 2295.7 | 0.982 |
| | 1.5667 | 0.6383 | 0.9201 | 1958.5 | 0.984 | 2298.4 | 0.983 |
| | 1.6667 | 0.6000 | 0.9201 | 1960.4 | 0.985 | 2300.8 | 0.984 |
| | 1.7667 | 0.5660 | 0.9201 | 1962.1 | 0.986 | 2302.9 | 0.985 |
| | 1.8667 | 0.5357 | 0.9201 | 1963.7 | 0.987 | 2304.8 | 0.986 |
| | 1.9667 | 0.5085 | 0.9201 | 1965.1 | 0.987 | 2306.6 | 0.987 |
| | 2.0667 | 0.4839 | 0.9200 | 1966.4 | 0.988 | 2308.2 | 0.987 |
| | 2.1667 | 0.4615 | 0.9200 | 1967.6 | 0.989 | 2309.6 | 0.988 |
| | 2.2667 | 0.4412 | 0.9200 | 1968.6 | 0.989 | 2310.9 | 0.989 |
| | 2.3667 | 0.4225 | 0.9200 | 1969.6 | 0.990 | 2312.1 | 0.989 |
| 1% | 2.4667 | 0.4054 | 0.9200 | 1970.5 | 0.990 | 2313.2 | 0.990 |
| | 2.5667 | 0.3896 | 0.9200 | 1971.4 | 0.990 | 2314.3 | 0.990 |
| | 2.6667 | 0.3750 | 0.9200 | 1972.2 | 0.991 | 2315.2 | 0.990 |
| | 2.7667 | 0.3614 | 0.9200 | 1972.9 | 0.991 | 2316.1 | 0.991 |
| | 2.8667 | 0.3488 | 0.9200 | 1973.6 | 0.992 | 2317.0 | 0.991 |
| | 2.9667 | 0.3371 | 0.9200 | 1974.2 | 0.992 | 2317.8 | 0.992 |
| | 3.0667 | 0.3261 | 0.9199 | 1974.8 | 0.992 | 2318.5 | 0.992 |

FIG 10

| Decrease in luminance (from prior simulation) at approx. 2000cd/m² | Transmission | Resistance ohm/sq | Thickness nm |
|---|---|---|---|
|  | 0.90 | 15.00 | 100 |
|  | 0.81 | 7.50 | 200 |
|  | 0.73 | 5.00 | 300 |
|  | 0.66 | 3.75 | 400 |
|  | 0.59 | 3.00 | 500 |
|  | 0.53 | 2.50 | 600 |
| 5% | 0.48 | 2.14 | 700 |
|  | 0.43 | 1.88 | 800 |
|  | 0.39 | 1.67 | 900 |
|  | 0.35 | 1.50 | 1000 |
|  | 0.31 | 1.36 | 1100 |
| 2% | 0.28 | 1.25 | 1200 |
|  | 0.25 | 1.15 | 1300 |
|  | 0.23 | 1.07 | 1400 |
|  | 0.21 | 1.00 | 1500 |
|  | 0.19 | 0.94 | 1600 |
|  | 0.17 | 0.88 | 1700 |
|  | 0.15 | 0.83 | 1800 |
|  | 0.14 | 0.79 | 1900 |
|  | 0.12 | 0.75 | 2000 |
|  | 0.11 | 0.71 | 2100 |
|  | 0.10 | 0.68 | 2200 |
|  | 0.09 | 0.65 | 2300 |
|  | 0.08 | 0.63 | 2400 |
|  | 0.07 | 0.60 | 2500 |
|  | 0.06 | 0.58 | 2600 |
|  | 0.06 | 0.56 | 2700 |
|  | 0.05 | 0.54 | 2800 |
|  | 0.05 | 0.52 | 2900 |
|  | 0.04 | 0.50 | 3000 |
|  | 0.04 | 0.48 | 3100 |
|  | 0.03 | 0.47 | 3200 |
|  | 0.03 | 0.45 | 3300 |
|  | 0.03 | 0.44 | 3400 |
|  | 0.03 | 0.43 | 3500 |
|  | 0.02 | 0.42 | 3600 |
| 1% | 0.02 | 0.41 | 3700 |
|  | 0.02 | 0.39 | 3800 |
|  | 0.02 | 0.38 | 3900 |
|  | 0.01 | 0.38 | 4000 |
|  | 0.01 | 0.37 | 4100 |
|  | 0.01 | 0.36 | 4200 |
|  | 0.01 | 0.35 | 4300 |
|  | 0.01 | 0.34 | 4400 |
|  | 0.01 | 0.33 | 4500 |
|  | 0.01 | 0.33 | 4600 |
|  | 0.01 | 0.32 | 4700 |
|  | 0.01 | 0.31 | 4800 |
|  | 0.01 | 0.31 | 4900 |
|  | 0.01 | 0.30 | 5000 |
|  | 0.00 | 0.29 | 5100 |

COMPONENT AND METHOD FOR PRODUCING A COMPONENT

RELATED APPLICATIONS

The present application is a national stage entry according to 35 U.S.C. § 371 of PCT application No.: PCT/EP2014/069877 filed on Sep. 18, 2014, which claims priority from German application No.: 10 2013 110 449.5 filed on Sep. 20, 2013, and is incorporated herein by reference in its entirety.

TECHNICAL FIELD

In various embodiments, a component and a method for producing a component are provided.

BACKGROUND

Optoelectronic components on an organic basis, for example organic light emitting diodes (OLEDs) are being increasingly widely used in general lighting, for example as a surface light source, or for representing information for example as a sign.

An organic optoelectronic component, for example an OLED, may include an anode and a cathode with an organic functional layer system therebetween. The organic functional layer system may include one or a plurality of emitter layer(s) in which electromagnetic radiation is generated, one or a plurality of charge generating layer structure(s) each composed of two or more charge generating layers (CGL) for charge generation, and one or a plurality of electron blocking layer(s), also designated as hole transport layer(s) (HTL), and one or a plurality of hole blocking layer(s), also designated as electron transport layer(s) (ETL), in order to direct the current flow. In one conventional method, a metallization is applied on a glass substrate and the electrodes of the OLED are electrically contacted by means of the metallization. The metallization is conventionally formed as an electrical busbar and/or contact pads. The metallization can conventionally be optically inactive, i.e. emit no light. Furthermore, as encapsulation, a glass cover is laminated and/or a thin-film encapsulation is deposited onto the electrode on the organic functional layer system, for example by of chemical vapor deposition (CVD) or atomic layer deposition (ALD).

In a conventional OLED, the laminated glass cover, the metallization, for example in the form of contact pads; the cathode and/or the anode can have a different transmissivity for electromagnetic radiation. As a result, conventional transparent OLEDs, on account of the laminated glass cover for encapsulation and the metallization for electrical contacting, can have lateral variations in at least one optical variable, for example the transmission, absorption and/or reflection of electromagnetic radiation. As a result, electromagnetic radiation incident on the transparent OLED is reflected, transmitted and/or absorbed differently in the region of the metallization, for example, than in the light emitting region of the OLED. By means of this variation, information to be represented can be altered undesirably, for example in the case of an optoelectronic component in the form of a sign.

Furthermore, individual regions of a conventional optoelectronic component can absorb electromagnetic radiation to different extents. As a result, the individual regions can heat up differently and, for example, thermal strains and/or thermoelectric voltages can be generated in the optoelectronic component.

Hitherto, OLEDs have been produced with metallic contact pads outside the optically active region, that is to say in the optically inactive region, in order to ensure the external contacting of the anode and cathode. Alternatively, a combination of indium tin oxide and a metallic layer has also been used hitherto. The metallic contacts also serve for current distribution outside the OLED in order that the anode and/or the cathode are/is supplied with current uniformly. In conventional components, a metallic layer is always used for current distribution in order to supply the anode with current uniformly.

SUMMARY

In various embodiments, a component and a method for producing a component are provided which make it possible to form a component having an optical variable that is more homogeneous laterally, for example in the optically inactive state.

As a result, for example, a transparent OLED can have laterally a more homogeneous transmissivity, absorption and/or reflectivity of electromagnetic radiation and thus have more homogeneous shadow casting, i.e. a more homogeneous field distribution, for the transmitted electromagnetic radiation, for example for components designed as filter, light source and/or photosensor.

Furthermore, electromagnetic radiation can be absorbed more homogeneously laterally in the optoelectronic component and lead to more uniform heating of the optoelectronic component.

As a result, thermal strains and/or thermoelectric voltages can be reduced in the optoelectronic component.

Furthermore, as a result, in an optoelectronic component for representing information for example a pictogram, an ideogram a color profile and/or lettering, by means of a more homogeneous reflectivity and/or absorption the information can be represented with a higher contrast, a larger light emitting area and/or with reduced impairment of the information content of the information to be represented.

In various embodiments, a component and a method for producing a component are provided which make it possible to form a component having free-standing luminous areas on a substrate without metallic contacts, for example also referred to as metallization. In other words, OLEDs are provided which are substantially transparent on the entire substrate area, including outside the active area. New design freedoms arise as a result. The metallization is important for the uniform current distribution at the anode and cathode, on account of the high conductivity primarily in relation to a transparent electrode.

In various embodiments, a component is provided, the component including: an optically active region, wherein an optical property of the optically active region is electrically controllable; and an optically inactive region, which is formed alongside the optically active region; wherein the optically inactive region and/or the optically active region have/has an adaptation structure designed to adapt a value of an optical variable in the optically inactive region to a value of the optical variable in the optically active region.

In one configuration, an optical property can be transmitting, reflecting, absorbing, emitting and/or converting electromagnetic radiation.

In one configuration, the component can be formed as a surface component having a planar optically active region, for example as surface lighting, for example a planar organic light emitting diode; or surface detector. By virtue of the fact that the value of the optical variable of the optically inactive region is adapted to the value of the optical variable of the optically active region, the component has areally a more homogeneous value of the optical variable. As a result, the component can be formed in such a way that it has for example a more homogeneous appearance, more homogeneous shadow casting and/or more homogeneous heating.

In one configuration, the component may include an electro-optical component, for example an electrically switchable optical filter, an electrically switchable mirror; and/or an optoelectronic component, for example an organic light emitting diode, a display, a photosensor and/or a solar cell; or can be formed in such a way.

In one configuration, the component may furthermore include a carrier, wherein the optically active region and the optically inactive region are formed on the carrier.

In one configuration, the optically active region and the optically inactive region can be different regions on the carrier.

In one configuration, the component may furthermore include an encapsulation, wherein the encapsulation is formed in such a way that the optically active region, the optically inactive region and/or the adaptation structure are hermetically sealed with respect to at least water and/or oxygen. In other words: the adaptation structure can be integrated with the optically inactive region and/or the optically active region.

In one configuration, the encapsulation may include a hermetically impermeable carrier, a hermetically impermeable thin-film encapsulation and/or a hermetically impermeable cover. A hermetically impermeable carrier can, for example, be intrinsically hermetically impermeable or include a barrier layer.

In one configuration, the optically active region may include a first electrode, a second electrode and an organic functional layer structure, wherein the organic functional layer structure is formed between the first electrode and the second electrode, and wherein the organic functional layer structure is designed for emitting the electromagnetic radiation and/or converting the electromagnetic radiation into an electrical current and/or an electrical voltage.

In one configuration, the component may furthermore include at least one intermediate electrode, wherein the at least one intermediate electrode is formed between the first electrode and the second electrode.

In one configuration, the optically active region may include a first electrode, a second electrode and a cavity structure, wherein the cavity structure is formed between the first electrode and the second electrode, and wherein the cavity structure is designed for electrically controllably transmitting, reflecting and/or absorbing the electromagnetic radiation.

In one configuration, the cavity structure may include electrically polarizable particles in liquid-filled cavities.

In one configuration, the optically active region may include a plurality of optically active regions.

In one configuration, the plurality of optically active regions can differ in at least one value of an optical variable with regard to the electromagnetic radiation.

In one configuration, the plurality of optically active regions can be formed such that they are drivable independently of one another at least in part.

In one configuration, the optically inactive region can have an electrically conductive contact structure, wherein the electrically conductive contact structure is designed for forwarding a current for energizing the optically active region In one configuration, the contact structure may include at least one contact pad and/or at least one electrical busbar.

In one configuration, the optically inactive region can be formed in an edge region of the component, for example at the edge of the planar side of a planar carrier. Furthermore, a region with which the component is fitted into a mount can be provided in the optically inactive region.

In one configuration, the optically inactive region can be at least partly surrounded by the optically active region, for example formed as an electrical busbar within the optically active region.

In one configuration, the adaptation structure may include one or a plurality of layers. One layer may include a plurality of regions (adaptation regions) alongside one another, wherein the plurality of regions can be formed differently with regard to the value of the optical variable.

In one configuration, the plurality of layers of the adaptation structure may each include a different material or be formed in such a way.

In one configuration, the adaptation structure may include one or a plurality of laterally structured layers.

In one configuration, the adaptation structure can be formed at least partly on, above and/or in the optically active region.

In one configuration, the adaptation structure can be formed at least partly on, above and/or in the optically inactive region.

In one configuration, the adaptation structure can be formed at least partly on, above and/or in the carrier and/or the encapsulation.

In one configuration, the adaptation structure at least partly can have the layer structure of the optically active region, of which the optically inactive region is free. In other words: the adaptation structure can at least partly have the layer structure which is formed in the optically active region and is not formed in the optically inactive region. Said layer structure can, for example, have no further optical effect than adapting the value of the optical variable, for example be optically inactive.

In one configuration, the layer structure of the adaptation structure can be formed in an optically inactive fashion or be formed in an electrically insulating fashion with respect to the electrical connection of the optically active region.

In one configuration, the adaptation structure, with respect to the electromagnetic radiation, may include or be formed from a wavelength-converting material.

In one configuration, the adaptation structure, with respect to the electromagnetic radiation, may include or be formed from scattering particles distributed in a matrix.

In one configuration, the adaptation structure, with respect to the electromagnetic radiation, may include or be formed from refractive-index-changing and/or color-changing nanoparticles distributed in a matrix.

In one configuration, the adaptation structure, with respect to the electromagnetic radiation, may include an optically anisotropic substance, be formed therefrom and/or be formed in such a way, for example be formed in a birefringent fashion.

In one configuration, the adaptation structure may include or be formed from a getter with respect to water and/or oxygen.

In one configuration, the adaptation structure can be formed at least regionally in an electrically conductive fashion. Regionally can relate to one region or a plurality of regions of a layer and/or one layer or a plurality of layers of a layer cross section.

In one configuration, the adaptation structure may include or be formed from indium tin oxide.

In one configuration, the adaptation structure can be formed at least regionally in an electrically insulating fashion or in an electrically insulated fashion.

In one configuration, the adaptation structure can be formed above and/or below a contact pad.

In one configuration, the adaptation structure can be formed in an adhesion-reinforcing fashion and/or in a cohesion-reinforcing fashion with respect to the structure of the optically inactive region and/or optically active region without an adaptation structure on/in/above which the adaptation structure is formed.

In one configuration, the adaptation structure can be formed as a shield with respect to electromagnetic radiation, for example with respect to UV radiation or microwave radiation.

In one configuration, the adaptation structure can be formed in such a way that the value of the optical variable of the optically active region and the value of the optical variable of the optically inactive region are adapted to a predefined value.

In one configuration, the adaptation structure can be formed in such a way that the value of the optical variable of the optically active region and the value of the optical variable of the optically inactive region have a difference of less than approximately 10% with regard to the value of the optical variable of the optically active region.

In one configuration, the adaptation structure can be formed in such a way that predefined information becomes representable, for example in the form of a frame or passepartout.

In one configuration, the adaptation structure can be formed in such a way that the optically inactive region with the adaptation structure is formed in a beam shaping fashion for transmitted and/or reflected electromagnetic radiation, for example in a diffusely reflective fashion or in the form of an optical lens.

In various embodiments, a method for producing a component is provided, the method including: determining the difference between a value of an optical variable in an optically active region and a value of the optical variable in an optically inactive region of a component; determining an adaptation structure on the basis of the determined difference in such a way that the value of the optical variable in the optically inactive region is adapted to the value of the optical variable in the optically active region; forming the determined adaptation structure in and/or on the optically inactive region and/or optically active region.

Forming an optically active region in such a way that an optical property of the optically active region is electrically controllable; forming an optically inactive region, wherein the optically active region and the optically inactive region are formed alongside one another; determining the difference between a value of an optical variable in the optically active region and a value of the optical variable in the optically inactive region; determining an adaptation structure on the basis of the determined difference in such a way that the value of the optical variable in the optically inactive region is adapted to the value of the optical variable in the optically active region; forming the determined adaptation structure in and/or on the optically inactive region and/or optically active region.

In one configuration of the method, an optical property can be transmitting, reflecting, absorbing, emitting and/or converting electromagnetic radiation.

In one configuration of the method, determining the difference may include determining the value of the optical variable in the optically active region.

In one configuration of the method, determining the difference may include determining the value of the optical variable in the optically inactive region.

In one configuration of the method, determining the adaptation structure may include selecting a material of a layer of the adaptation structure.

In one configuration of the method, determining the adaptation structure may include selecting the position of a layer of the adaptation structure in the beam path through the optically active region and/or the optically inactive region.

In one configuration of the method, determining the adaptation structure may include selecting a lateral position of a layer and/or structuring a layer of the adaptation structure in the adaptation structure.

In one configuration of the method, the adaptation structure can be formed in an integrated fashion in the optically active region and/or in the optically inactive region.

In one configuration of the method, determining may include measuring and/or calculating the value of the optical variable of the optically active region and/or of the optically inactive region.

In one configuration of the method, determining the value of the optical variable of the optically active region and/or of the optically inactive region may include detecting a plurality of measurement values.

In one configuration of the method, the plurality of measurement values can be detected at locally different regions of the optically active region and/or of the optically inactive region, for example from the contact structure, the laminating strips, the organic functional layer structure and/or further regions.

In one configuration of the method, the plurality of measurement values can have different wavelength spectra, different polarizations, different intensities and/or different angles of incidence on the optoelectronic component.

In one configuration of the method, the optoelectronic component can be formed as a surface component having a planar optically active region.

In one configuration of the method, the component may include an electro-optical component, for example an electrically switchable optical filter, an electrically switchable mirror; and/or a optoelectronic component, for example an organic light emitting diode, a display, a photosensor and/or a solar cell; or can be formed in such a way.

In one configuration of the method, the method may furthermore include providing a carrier, wherein the optically active region and the optically inactive region are formed on the carrier.

In one configuration of the method, the optically active region and the optically inactive region can be formed as different regions on the carrier.

In one configuration of the method, the method may furthermore include forming an encapsulation, wherein the encapsulation is formed in such a way that the optically active region, the optically inactive region and/or the adaptation structure are hermetically sealed with respect to at least water and/or oxygen.

In one configuration of the method, the encapsulation can be formed with a hermetically impermeable carrier, a hermetically impermeable thin-film encapsulation and/or a hermetically impermeable cover.

In one configuration of the method, the optically active region can be formed with a first electrode, a second electrode and an organic functional layer structure, wherein the organic functional layer structure is formed between the first electrode and the second electrode, and wherein the organic functional layer structure is designed for emitting the electromagnetic radiation and/or converting the electromagnetic radiation into an electrical current and/or an electrical voltage.

In one configuration of the method, the method may furthermore at least include forming one intermediate electrode, wherein the at least one intermediate electrode can be formed between the first electrode and the second electrode.

In one configuration of the method, the optically active region can be formed with a first electrode, a second electrode and a cavity structure, wherein the cavity structure is formed between the first electrode and the second electrode, and wherein the cavity structure is designed for electrically controllably transmitting, reflecting and/or absorbing the electromagnetic radiation.

In one configuration of the method, the cavity structure can be formed in such a way that it includes electrically polarizable particles in liquid-filled cavities.

In one configuration of the method, the optically active region can be formed with a plurality of optically active regions.

In one configuration of the method, the plurality of optically active regions can be formed in such a way that they differ in at least one value of an optical variable with respect to the electromagnetic radiation.

In one configuration of the method, the plurality of optically active regions can be formed such that they are drivable independently of one another at least in part.

In one configuration of the method, the optically inactive region can be formed with an electrically conductive contact structure, wherein the electrically conductive contact structure is designed for forwarding a current for energizing the optically active region.

In one configuration of the method, the contact structure can be formed with at least one contact pad and/or at least one electrical busbar.

In one configuration of the method, the optically inactive region can be formed in an edge region of the component.

In one configuration of the method, the optically inactive region can be formed in a manner at least partly surrounded by the optically active region, for example be formed as an electrical busbar within the optically active region.

In one configuration of the method, the adaptation structure can be formed with one or a plurality of layers.

In one configuration of the method, the plurality of layers of the adaptation structure can each be formed from different materials.

In one configuration of the method, one layer or a plurality of layers of the adaptation structure can be formed in a laterally structured fashion.

In one configuration of the method, the adaptation structure can be formed at least partly on, above and/or in the optically active region.

In one configuration of the method, the adaptation structure can be formed at least partly on, above and/or in the optically inactive region.

In one configuration of the method, the adaptation structure can be formed at least partly on, above and/or in the carrier and/or the encapsulation.

In one configuration of the method, the adaptation structure can be formed in such a way that the adaptation structure at least partly has the layer structure of the optically active region, of which the optically inactive region is free.

In one configuration of the method, the layer structure of the adaptation structure can be formed in an optically inactive fashion or be formed in an electrically insulating fashion with respect to the electrical connection of the optically active region.

In one configuration of the method, the adaptation structure, with respect to the electromagnetic radiation, can be formed from a wavelength-converting material.

In one configuration of the method, the adaptation structure, with respect to the electromagnetic radiation, may include or be formed from scattering particles distributed in a matrix.

In one configuration of the method, the adaptation structure, with respect to the electromagnetic radiation, may include or be formed from refractive-index-changing and/or color-changing nanoparticles distributed in a matrix.

In one configuration of the method, the adaptation structure, with respect to the electromagnetic radiation, may include an optically anisotropic substance, be formed therefrom and/or be formed in such a way, for example be formed in a birefringent fashion.

In one configuration of the method, the adaptation structure may include or be formed from a getter with respect to water and/or oxygen.

In one configuration of the method, the adaptation structure can be formed at least regionally in an electrically conducive fashion.

In one configuration of the method, the adaptation structure can be formed at least regionally in an electrically insulating fashion or in an electrically insulated fashion.

In one configuration of the method, the adaptation structure can be formed above and/or below a contact pad.

In one configuration of the method, the adaptation structure can be formed in an adhesion-reinforcing fashion and/or in a cohesion-reinforcing fashion, for example with regard to the layers of the optically inactive region and/or the optically inactive region with respect to the carrier or respective substrate of a layer.

In one configuration of the method, the adaptation structure can be formed as a shield with respect to electromagnetic radiation, for example with respect to UV radiation.

In one configuration of the method, the adaptation structure can be formed in such a way that the value of the optical variable of the optically active region and the value of the optical variable of the optically inactive region are adapted to a predefined value.

In one configuration of the method, the adaptation structure can be formed in such a way that the value of the optical variable of the optically active region and the value of the optical variable of the optically inactive region have a difference of less than approximately 10% with regard to the value of the optical variable of the optically active region.

In one configuration of the method, the adaptation structure can be formed in such a way that predefined information becomes representable, for example in the form of a frame or a passepartout.

In one configuration of the method, the adaptation structure can be formed in such a way that the optically inactive region with adaptation structure are formed in a beam shaping fashion for transmitted and/or reflected electromagnetic radiation, for example in a diffusely reflective fashion.

In various embodiments, a component is provided. The component includes: a carrier; an optically active region having a first electrode, a second electrode and an organic functional layer structure, wherein the organic functional layer structure is arranged between the first and second electrodes; an optically inactive region arranged alongside the optically active region; an electrically conductive frame having a first frame element and a second frame element, which partly surround the optically active region; wherein the electrically conductive frame is formed on the carrier; wherein the first electrode is arranged on or above the carrier in such a way that it partly covers the optically active region; wherein the first electrode is connected to the first frame element; wherein the second electrode is connected to the second frame element; and wherein the electrically conductive frame is formed from a transparent conductive oxide.

In one configuration, the electrically conductive frame and the first electrode may include or be formed from indium tin oxide.

In one configuration, an optically functional layer can be arranged between the first frame element and the second frame element.

In one configuration, the optically functional layer can be a scattering layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIGS. 4A, 4B show schematic illustrations of optoelectronic components in accordance with various embodiments;

FIG. 9 shows a tabular illustration of a simulation of a luminance distribution of an optoelectronic component in accordance with various embodiments.

FIG. 10 shows a tabular illustration of a simulation of a transmission of an optoelectronic component in accordance with various embodiments.

DETAILED DESCRIPTION

Figure 1:
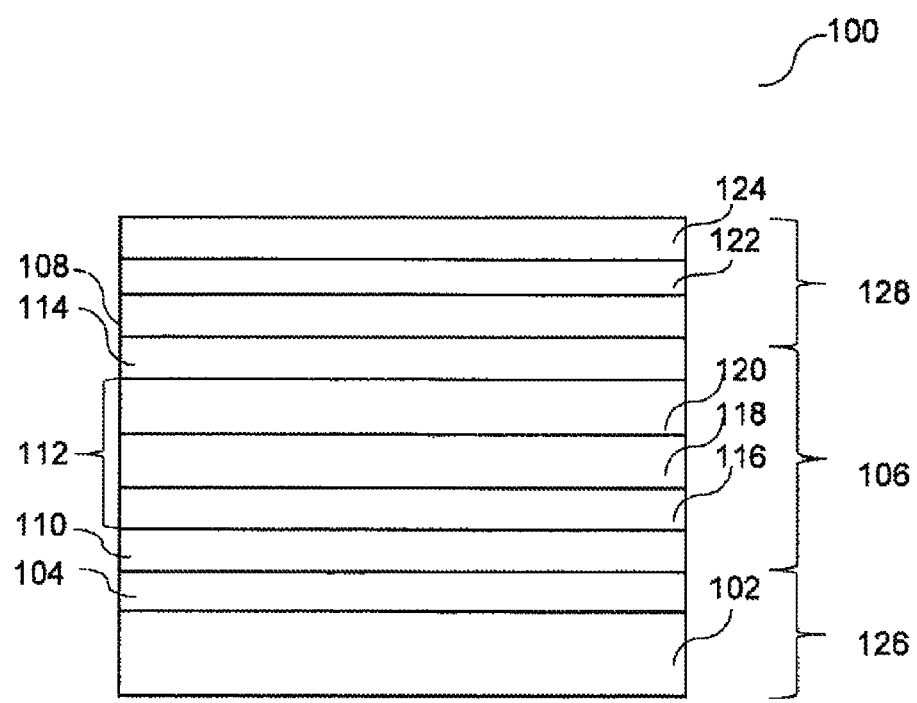
FIG. 1 shows a schematic cross-sectional view of an optoelectronic component in accordance with various embodiments.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

The component described in various embodiments can be or include an electro-optical component and/or an optoelectronic component. The component includes an optically active region. The optically active region is designed for electrically controllably transmitting, reflecting, absorbing, emitting and/or converting electromagnetic radiation.

A component having an optically active region can have one or a plurality of optically active sides. A planar component having two planar optically active sides can be formed for example as transparent or translucent in the connection direction of the optically active sides. However, the optically active region can also have a planar optically active side and a planar optically inactive side, for example an organic light emitting diode formed as a top emitter or a bottom emitter. The optically inactive side can be provided for example with a mirror structure, for example a mirror structure having an electrically switchable reflectivity, and/or an opaque substance or substance mixture, for example for heat distribution; whereby the beam path of the component can be directed.

In various embodiments, optoelectronic components are described, wherein an optoelectronic component includes an optically active region. The optically active region of an optoelectronic component can absorb, and form a photocurrent therefrom, i.e. convert electromagnetic radiation; or emit electromagnetic radiation by means of a voltage applied to the optically active region. In various embodiments, the electromagnetic radiation can have a wavelength range including x-ray radiation, UV radiation (A-C), visible light and/or infrared radiation (A-C).

Providing electromagnetic radiation can be understood to mean emitting electromagnetic radiation. In other words, providing electromagnetic radiation can be understood as emitting electromagnetic radiation by means of a voltage applied to an optically active region.

Taking up electromagnetic radiation can be understood to mean absorbing electromagnetic radiation. In other words: taking up electromagnetic radiation can be understood to mean absorbing electromagnetic radiation and forming a photocurrent from the absorbed electromagnetic radiation. In other words: absorbing electromagnetic radiation can be understood to mean converting electromagnetic radiation into an electrical current and/or an electrical voltage.

In various configurations, an electromagnetic radiation emitting structure can be an electromagnetic radiation emitting semiconductor structure and/or be formed as an electromagnetic radiation emitting diode, as an organic electromagnetic radiation emitting diode, as an electromagnetic radiation emitting transistor or as an organic electromagnetic radiation emitting transistor. The radiation can be for example light (in the visible range), UV radiation and/or infrared radiation. In this context, the electromagnetic radiation emitting component can be formed for example as a light emitting diode (LED), as an organic light emitting diode (OLED), as a light emitting transistor or as an organic light emitting transistor. In various configurations, the electromagnetic radiation emitting component can be part of an integrated circuit. Furthermore, a plurality of electromagnetic radiation emitting components can be provided, for example in a manner accommodated in a common housing.

In various embodiments, an optoelectronic structure can be formed as an organic light emitting diode (OLED), an organic field effect transistor (OFET) and/or an organic electronic system. The organic field effect transistor can be a so-called "all-OFET", in which all the layers are organic. An optoelectronic structure may include an organic functional layer system, which is synonymously also designated as organic functional layer structure. The organic functional layer structure may include or be formed from an organic substance or an organic substance mixture which is formed for example for providing an electromagnetic radiation from an electric current provided.

An electro-optical component can be formed in such a way that it can change at least one optical variable under the influence of an electric field. In other words: in various embodiments, the electro-optical component can be formed in such a way that, by means of a control signal being applied to the electro-optical component, the optical properties of the electro-optical component are changed, for example the transmission, the absorption and/or the reflection of electromagnetic radiation through/in/from the electro-optical component. A control signal can be for example the change of a voltage applied to the electro-optical component or a change of the current intensity through the electro-optical component. The optical properties of a transmissive component can be changed for example in a range of from 0% (no change), to 100% (complete change). Changing the electromagnetic radiation being transmitted can also be changing the direction of polarization of the electromagnetic radiation being transmitted, for example for the case where the optically active structure has at least one preferred direction of the polarization with regard to electromagnetic radiation taken up.

An electro-optical component can be formed in such a way that the optical properties of the electro-optical component change abruptly, i.e. instantaneously, discretely, discontinuously; upon a control signal being applied to the electro-optical component. However, an electro-optical component can also be formed in such a way that the optical properties of the electro-optical component change in a continuous way, i.e. fluidly, continuously; upon a control signal being applied to the electro-optical component.

In various embodiments, an electro-optical component can be formed as a film, for example provided with an adhesive or an adhesion layer.

In various embodiments, an electro-optical component can be formed as a colored, matt, silvery and/or diffuse structure whose transmittance is electrically settable. The transmittance can be set by means of changing the reflectivity and/or the absorption of the electro-optical component.

In various embodiments, an electro-optical component can be formed as an electrically switchable mirror having a tunable reflectivity. In various embodiments, the reflectivity can be tuned in an electrochromic-electrical, gasochromic and/or thermochromic manner.

In various embodiments, the optical variable may include at least one of the following optical variables with regard to the electromagnetic radiation: the absorption, the reflectivity, the transmittivity, the refractive index, the scattering cross section, the dispersion, the intensity, the polarization.

In various embodiments, the electromagnetic radiation can have an intensity in at least one of the following wavelength ranges: that of UV radiation, that of visible light, that of infrared radiation, that of microwave radiation.

In one configuration, the adaptation structure may include a matrix and at least one type of additive.

In one configuration, at least one type of additives can be distributed in the matrix. The at least one type of distributed additives can be formed as particles, i.e. particulate additives.

In one configuration, at least one type of additives can be dissolved in the matrix.

In one configuration, the adaptation structure—depending on the specific implementation of the adaptation structure in/on/above the optically active region and/or the optically inactive region—can be formed in such a way that the coefficient of thermal expansion of the adaptation structure is adapted to the coefficients of thermal expansion of the optically active region and/or of the optically inactive region, for example within a range of approximately 50%, for example within a range of approximately 40%, for example within a range of approximately 30%, for example within a range of approximately 20%, for example within a range of approximately 10%, for example approximately equal relative to the coefficients of thermal expansion of the optically active region and/or of the optically inactive region.

In one configuration, the matrix of the at least one layer including the matrix of the adaptation structure may include or be formed from a glass solder and/or plastic.

In one configuration, the adaptation structure can be formed, for example arranged, over the whole area on/above/in the optically active region and/or the optically inactive region.

In one configuration, the adaptation structure can have an average refractive index greater than or approximately equal to the refractive index of further layers in the layer cross section of the optically active region and/or of the optically inactive region.

In one configuration, the adaptation structure can have a refractive index of at least approximately 1.5; for example a refractive index of at least approximately 1.6; for example a refractive index of at least approximately 1.65; for example a range of approximately 1.5 to approximately 2.1.

In one configuration, the adaptation structure can have a thickness in a range of approximately 0.01 µm to approximately 100 µm, for example in a range of approximately 0.1 µm to approximately 100 µm, for example in a range of approximately 1 µm to approximately 100 µm, for example approximately 2 µm.

In one configuration, the matrix of the adaptation structure can have a refractive index of greater than approximately 1.7.

In one configuration, the matrix of the adaptation structure can be formed in an amorphous fashion. The substance or the substance mixture of the matrix can also be designed as molding material or potting material.

In one configuration, the matrix of the adaptation structure may include or be formed from a substance or substance mixture from the group of the glass systems: PbO-containing systems: $PbO—B_2O_3$, $PbO—SiO_2$, $PbO—B_2O_3—SiO_2$, $PbO—B_2O_3—ZnO_2$, $PbO—B_2O_3—Al_2O_3$, wherein the PbO-containing glass solder may also include $Bi_2O_3$; $Bi_2O_3$-containing systems: $Bi_2O_3—B_2O_3$, $Bi_2O_3—B_2O_3—SiO_2$, $Bi_2O_3—B_2O_3—ZnO$, $Bi_2O_3—B_2O_3—ZnO—SiO_2$.

The Bi-containing adaptation structure may additionally include a substance or a substance mixture from the group of the following substances: $Al_2O_3$, alkaline earth metal oxides, alkali metal oxides, $ZrO_2$, $TiO_2$, $HfO_2$, $Nb_2O_5$, $Ta_2O_5$, $TeO_2$, $WO_3$, $MO_3$, $Sb_2O_3$, $Ag_2O$, $SnO_2$, rare earth oxides.

The glass of the matrix can be admixed with UV-absorbing additives as glass components. By way of example, substances or substance mixtures including Ce, Fe, Sn, Ti, Pr, Eu and/or V compounds can be added as glass batch constituents to glasses having a low melting point, for example lead-containing glasses, in order to increase the UV absorption, in the glass melt process.

The glass melting process can be understood to mean thermal liquefaction, i.e. melting, of a glass. The UV-absorbing additives can be dissolved in the glass as a constituent. After the glass melting process, the glass can be powdered, applied to a carrier in the form of coatings and then be vitrified by means of a thermal treatment.

The substance or the substance mixture of the matrix can have an intrinsically lower UV transmission than the optically active region and/or the optically inactive region. By means of the lower UV transmission of the matrix, it is possible to form UV protection for layers on or above the adaptation structure. The lower UV transmission of the matrix of the adaptation structure with regard to the substrate can be formed for example by means a higher absorption and/or reflection of UV radiation.

In one configuration, the substance or the substance mixture of the matrix of the adaptation structure can be liquefied at a temperature of up to a maximum of approximately 600° C.

In one configuration, the matrix may include or be formed from one of the following substances: a silicone, for example polydimethylsiloxane, polydimethylsiloxane/polydiphenyl-siloxane; a silazane, an epoxide, a polyacrylate, a polycarbonate, for example a silicone hybrid, a silicone-epoxide hybrid.

In one configuration, the additives of the matrix of a layer of the adaptation structure may include or be formed from an inorganic substance or an inorganic substance mixture. The at least one type of additive may include or be formed from a substance or a substance mixture or a stoichiometric compound from at least one of the following substances: $TiO_2$, $CeO_2$, $Bi_2O_3$, $ZnO$, $SnO_2$, $Al_2O_3$, $SiO_2$, $Y_2O_3$, $ZrO_2$, phosphors, colorants, and UV-absorbing glass particles, suitable UV-absorbing metallic nanoparticles, wherein the phosphors are designed for wavelength conversion.

The at least one type of additive can be formed as particles, i.e. particulate additives. The at least one type of additive can have a curved surface, for example in a manner similar or identical to an optical lens. The at least one type of particulate additives can have one of the following geometric shapes and/or a part of one of the following geometric shapes: spherical, aspherical, for example prismatic, ellipsoid, hollow, compact, laminar or rod-shaped. The particulate additives may include or be formed from a glass. The particulate additives can have an average grain size in a range of approximately 0.05 μm to approximately 10 μm, for example in a range of approximately 0.1 μm to approximately 1 μm.

The additives can have one ply having a thickness of approximately 0.1 μm to approximately 100 μm on/above/in the optically active region and/or the optically inactive region in the adaptation structure. The additives of the adaptation structure can have a plurality of plies one above another on/above/in the optically active region and/or the optically inactive region, wherein the individual plies can be formed differently. In the plies of the additives, the average size of the particulate additives of at least one type of a particulate additive can decrease from the surface of the substrate. The individual plies of the additives can have a different average size of the particulate additives and/or a different transmission for electromagnetic radiation in at least one wavelength range, for example with a wavelength of less than approximately 400 nm. The individual plies of the additives can have a different average size of the particulate additives and/or a different refractive index for electromagnetic radiation.

In one configuration, the adaptation structure can be designed as a scattering layer, i.e. as a coupling-out layer or coupling-in layer.

In one configuration, the adaptation structure may include particulate additives which are designed as scattering particles for electromagnetic radiation, for example light, wherein the scattering particles can be distributed in the matrix. In other words: the matrix may include at least one type of scattering additives, such that the adaptation structure can form a scattering effect with regard to incident electromagnetic radiation in at least one wavelength range, for example by means of a refractive index of the scattering particles or scattering additives that is different relative to the matrix, and/or a diameter corresponding approximately to at least one quarter of the magnitude of the wavelength of the radiation to be scattered. The scattering effect can concern electromagnetic radiation which is emitted or absorbed by an organic functional layer system on or above the adaptation structure, in order to increase the coupling-out of light or coupling-in of light.

In one configuration, the adaptation structure including scattering additives can have a difference between the refractive index of the scattering additives and the refractive index of the matrix of greater than approximately 0.05.

In one configuration, the adaptation structure may include or be formed from a colorant. As a result, the optical appearance of the adaptation structure can be varied by means of the colorant. As a result, the optical appearance of the region of the optically active region and/or of the optically inactive region with adaptation structure can be varied in terms of color. In other words: the adaptation structure can be designed as a color layer.

In one configuration, an adaptation structure may include or be formed from a UV-absorbing additive. In other words: the adaptation structure can be designed as a UV protection layer.

In one configuration, an adaptation structure may include or be formed from a wavelength-converting additive, for example include a phosphor. In other words, the adaptation structure can be designed as a phosphor layer and convert the wavelength of electromagnetic radiation, for example in a Stokes-type or Anti-Stokes-type fashion.

In one configuration, an additive of the adaptation structure can be designed as a getter. In other words: the adaptation structure may be designed as a getter layer or include such a layer.

In one configuration, the additives can scatter electromagnetic radiation, absorb UV radiation, convert the wavelength of electromagnetic radiation, color the adaptation structure and/or bind harmful substances.

Additives which for example can scatter electromagnetic radiation and can absorb no UV radiation may include or be formed from $Al_2O_3$, $SiO_2$, $Y_2O_3$ or $ZrO_2$, for example.

Additives which for example scatter electromagnetic radiation and convert the wavelength of electromagnetic radiation can be designed for example as glass particles with a phosphor.

FIG. 1 shows a schematic cross-sectional view of an optoelectronic component as one embodiment of a component in accordance with various embodiments.

The optoelectronic component 100 can be formed as an organic light emitting diode 100, an organic photodetector 100, a display, and/or an organic solar cell.

An organic light emitting diode 100 can be formed as a top emitter or a bottom emitter. In the case of a bottom emitter, light is emitted from the electrically active region through the carrier. In the case of a top emitter, light is emitted from the top side of the electrically active region and not through the carrier.

A top emitter and/or bottom emitter can also be formed as optically transparent or optically translucent; by way of example, each of the layers or structures described below can be formed as transparent or translucent.

The optoelectronic component 100 includes a hermetically impermeable substrate 126, an active region 106 and an encapsulation structure 128.

The hermetically impermeable substrate may include a carrier 102 and a first barrier layer 104.

In various configurations, a substance that is hermetically impermeable with respect to water or a hermetically impermeable substance mixture may include or be formed from a ceramic, a metal and/or a metal oxide, for example a metal oxide ceramic.

The active region 106 is an electrically active region 106 and/or an optically active region 106. The active region 106 is for example the region of the optoelectronic component 100 in which electric current for the operation of the optoelectronic component 100 flows and/or in which electromagnetic radiation is generated and/or absorbed.

The electrically active region 106 may include a first electrode 110, an organic functional layer structure 112 and a second electrode 114.

The organic functional layer structure 106 may include one, two or more functional layer structure units and one, two or more intermediate layer structure(s) between the layer structure units. The organic functional layer structure 112 may include for example a first organic functional layer structure unit 116, an intermediate layer structure 118 and a second organic functional layer structure unit 120.

The encapsulation structure 128 may include a second barrier layer 108, a close connection layer 122 and a cover 124.

The carrier 102 may include or be formed from glass, quartz and/or a semiconductor material. Furthermore, the carrier may include or be formed from a plastics film or a laminate including one or including a plurality of plastics films. The plastic may include or be formed from one or a plurality of polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN).

The carrier 102 may include or be formed from a metal, for example copper, silver, gold, platinum, iron, for example a metal compound, for example steel.

The carrier 102 can be embodied as opaque, translucent or even transparent.

The carrier 102 can be a part of a mirror structure or form the latter.

The carrier 102 can have a mechanically rigid region and/or a mechanically flexible region or be formed in this way, for example as a film.

The carrier 102 can be formed as a waveguide for electromagnetic radiation, for example can be transparent or translucent with respect to the emitted or absorbed electromagnetic radiation of the optoelectronic component 100.

The first barrier layer 104 may include or be formed from one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, and mixtures and alloys thereof.

The first barrier layer 104 can be formed by means of one of the following methods: an atomic layer deposition (ALD) method, for example a plasma enhanced atomic layer deposition (PEALD) method or a plasmaless atomic layer deposition (PLALD) method; a chemical vapor deposition (CVD) method, for example a plasma enhanced chemical vapor deposition (PECVD) method or a plasmaless chemical vapor deposition (PLCVD) method; or alternatively by means of other suitable deposition methods.

In the case of a first barrier layer 104 including a plurality of partial layers, all the partial layers can be formed by means of an atomic layer deposition method. A layer sequence including only ALD layers can also be designated as a "nanolaminate".

In the case of a first barrier layer 104 including a plurality of partial layers, one or a plurality of partial layers of the first barrier layer 104 can be deposited by means of a different deposition method than an atomic layer deposition method, for example by means of a vapor deposition method.

The first barrier layer 104 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

The first barrier layer 104 may include one or a plurality of high refractive index materials, for example one or a plurality of materials having a high refractive index, for example having a refractive index of at least 2.

Furthermore, it should be pointed out that, in various embodiments, a first barrier layer 104 can also be entirely dispensed with, for example for the case where the carrier 102 is formed in a hermetically impermeable fashion, for example includes or is formed from glass, metal, metal oxide.

The first electrode 104 can be formed as an anode or as a cathode.

The first electrode 110 may include or be formed from one of the following electrically conductive materials: a metal; a transparent conductive oxide (TCO); a network composed of metallic nanowires and nanoparticles, for example composed of Ag, which are combined with conductive polymers, for example; a network composed of carbon nanotubes which are combined with conductive polymers, for example; graphene particles and graphene layers; a network composed of semiconducting nanowires; an electrically conductive polymer; a transition metal oxide; and/or the composites thereof. The first electrode 110 composed of a metal or including a metal may include or be formed from one of the following materials: Ag, Pt, Au, Mg, Al, Ba, In, Ca, Sm or Li, and compounds, combinations or alloys of these materials. The first electrode 110 may include as transparent conductive oxide one of the following materials: for example metal oxides: for example zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped or be hole-conducting (p-TCO), or electron-conducting (n-TCO).

The first electrode 110 may include a layer or a layer stack of a plurality of layers of the same material or different materials. The first electrode 110 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

The first electrode 104 can have for example a layer thickness in a range of 10 nm to 500 nm, for example of less than 25 nm to 250 nm, for example of 50 nm to 100 nm.

The first electrode 110 can have a first electrical terminal, to which a first electrical potential can be applied. The first electrical potential can be provided by an energy source, for example a current source or a voltage source. Alternatively, the first electrical potential can be applied to an electrically conductive carrier 102 and the first electrode 110 can be electrically supplied indirectly through the carrier 102. The first electrical potential can be for example the ground potential or some other predefined reference potential.

FIG. 1 illustrates an optoelectronic component 100 including a first organic functional layer structure unit 116 and a second organic functional layer structure unit 120. In various embodiments, however, the organic functional layer structure 112 may also include more than two organic functional layer structures, for example 3, 4, 5, 6, 7, 8, 9, 10, or even more, for example 15 or more, for example 70.

The first organic functional layer structure unit 116 and the optionally further organic functional layer structures may be formed identically or differently, for example include an identical or different emitter material. The second organic functional layer structure unit 120, or the further organic functional layer structure units can be formed like one of the below-described configurations of the first organic functional layer structure unit 116.

The first organic functional layer structure unit 116 may include a hole injection layer, a hole transport layer, an emitter layer, an electron transport layer and an electron injection layer.

In an organic functional layer structure unit 112, one or a plurality of the layers mentioned can be provided, wherein identical layers can have a physical contact, can be only electrically connected to one another or can even be formed in a manner electrically insulated from one another, for example can be arranged alongside one another. Individual layers of the layers mentioned can be optional.

A hole injection layer can be formed on or above the first electrode 110. The hole injection layer may include or be formed from one or a plurality of the following materials: HAT-CN, Cu(I)pFBz, $MoO_x$, $WO_x$, $VO_x$, $ReO_x$, F4-TCNQ, NDP-2, NDP-9, Bi(III)pFBz, F16CuPc; NPB (N,N'-bis(naphthalen-1-yl)-N,N'-bis(phenyl)benzidine); beta-NPB N,N'-bis(naphthalen-2-yl)-N,N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPLF-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenyl-fluorene); spiro-TAD (2,2',7,7'-tetrakis(n,n-diphenylamino)-9,9'-spirobifluorene); 9,9-bis[4-(N,N-bisbiphenyl-4-ylamino)phenyl]-9H-fluorene; 9,9-bis[4-(N,N-bis-napthalen-2-ylamino)phenyl]-9H-fluorene; 9,9-bis[4-(N,N'-bisnaphthalen-2-yl-N,N'-bisphenylamino)phenyl]-9H-fluorene; N,N'-bis(phenanthren-9-yl)-N,N'-bis(phenyl)benzidine; 2,7-bis[N,N-bis(9,9-spirobifluoren-2-yl)amino)-9,9-spirobifluorene; 2,2'-bis[N,N-bis(biphenyl-4-yl)amino] 9,9-spirobifluorene; 2,2'-bis(N,N-diphenylamino)9,9-spirobifluorene; di-[4-(N,N-di-tolylamino)phenyl] cyclohexane; 2,2',7,7'-tetra(N,N-di-tolyl) aminospirobifluorene; and/or N,N,N',N'-tetranaphthen-2-ylbenzidine.

The hole injection layer can have a layer thickness in a range of approximately 10 nm to approximately 1000 nm, for example in a range of approximately 30 nm to approximately 300 nm, for example in a range of approximately 50 nm to approximately 200 nm.

A hole transport layer can be formed on or above the hole injection layer. The hole transport layer may include or be formed from one or a plurality of the following materials: NPB (N,N'-bis(naphthalen-1-yl)-N,N'-bis(phenyl)benzidine); beta-NPB N,N'-bis(naphthalen-2-yl)-N,N'-bis(phenyl)benzidine); TPD (N,N'-bis(3-methylphenyl)-N,N'-bis (phenyl)benzidine); spiro TPD (N,N'-bis(3-methylphenyl)-N,N'-bis(phenyl)benzidine); spiro-NPB (N,N'-bis (naphthalen-1-yl)-N,N'-bis(phenyl)spiro); DMFL-TPD N,N'-bis(3-methylphenyl)-N,N'-bis(phenyl)-9,9-dimethyl-fluorene); DMFL-NPB (N,N'-bis(naphthalen-1-yl)-N,N'-bis (phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bisbi-phenyl-4-yl-amino)phenyl]-9H-fluorene; 9,9-bis[4-(N,N-bisnaphthalen-2-ylamino)phenyl]-9H-fluorene; 9,9-bis[4-(N,N'-bisnaphthalen-2-yl-N—N'-bisphenylamino)phenyl]-9H-fluorene; N,N'-bis(phen-anthren-9-yl)-N,N'-bis(phenyl) benzidine; 2,7-bis[N,N-bis(9,9-spirobifluoren-2-yl)amino]-9,9-spirobifluorene; 2,2'-bis[N,N-bis(biphenyl-4-yl)amino] 9,9-spirobifluorene; 2,2'-bis(N,N-diphenylamino)9,9-spirobifluorene; di-[4-(N,N-ditolyl-amino)phenyl] cyclohexane; 2,2',7,7'-tetra(N,N-ditolyl)amino-spirobifluorene; and N,N,N',N'-tetranaphthalen-2-ylbenzidine, a tertiary amine, a carbazole derivative, a conductive polyaniline and/or polyethylene dioxythiophene.

The hole transport layer can have a layer thickness in a range of approximately 5 nm to approximately 50 nm, for example in a range of approximately 10 nm to approximately 30 nm, for example approximately 20 nm.

An emitter layer can be formed on or above the hole transport layer. Each of the organic functional layer structure units 116, 120 may include in each case one or a plurality of emitter layers, for example including fluorescent and/or phosphorescent emitters.

An emitter layer may include or be formed from organic polymers, organic oligomers, organic monomers, organic small, non-polymeric molecules ("small molecules") or a combination of these materials.

The optoelectronic component 100 may include or be formed from one or a plurality of the following materials in an emitter layer: organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl) iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl-(2,2')-bipyridine]ruthenium(III) complex) and blue fluorescent DPAVBi (4,4-bis[4-(di-p-tolyl-amino)styryl]biphenyl), green fluorescent TTPA (9,10-bis[N,N-di(p-tolyl) amino]anthracene) and red fluorescent DCM2 (4-dicyanomethylene)-2-methyl-6-julolidyl-9-enyl-4H-pyran) as non-polymeric emitters.

Such non-polymeric emitters can be deposited for example by means of thermal evaporation. Furthermore, polymer emitters can be used which can be deposited for example by means of a wet-chemical method, such as, for example, a spin coating method.

The emitter materials can be embedded in a suitable manner in a matrix material, for example a technical ceramic or a polymer, for example an epoxide; or a silicone.

In various embodiments, the emitter layer can have a layer thickness in a range of approximately 5 nm to approximately 50 nm, for example in a range of approximately 10 nm to approximately 30 nm, for example approximately 20 nm.

The emitter layer may include emitter materials that emit in one color or in different colors (for example blue and yellow or blue, green and red). Alternatively, the emitter layer may include a plurality of partial layers which emit light of different colors. By means of mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The organic functional layer structure unit 116 may include one or a plurality of emitter layers embodied as hole transport layer.

Furthermore, the organic functional layer structure unit 116 may include one or a plurality of emitter layers embodied as electron transport layer.

An electron transport layer can be formed, for example deposited, on or above the emitter layer.

The electron transport layer may include or be formed from one or a plurality of the following materials: NET-18; 2,2',2"-(1,3,5-benzinetriyl)tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium; 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-naphthalen-2-yl)phenyl)-1H-imidazo[4,5-f][1,10]phenanthroline; phenyl-dipyrenylphosphine oxide; naphthalenetetracarboxylic dianhydride or the imides thereof; perylenetetracarboxylic dianhydride or the imides thereof; and substances based on silols including a silacyclopentadiene unit.

The electron transport layer can have a layer thickness in a range of approximately 5 nm to approximately 50 nm, for example in a range of approximately 10 nm to approximately 30 nm, for example approximately 20 nm.

An electron injection layer can be formed on or above the electron transport layer. The electron injection layer may include or be formed from one or a plurality of the following materials: NDN-26, MgAg, Cs$_2$CO$_3$, Cs$_3$PO$_4$, Na, Ca, K, Mg, Cs, Li, LiF; 2,2',2"-(1,3,5-benzinetriyl)tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis(5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron injection layer can have a layer thickness in a range of approximately 5 nm to approximately 200 nm, for example in a range of approximately 20 nm to approximately 50 nm, for example approximately 30 nm.

In the case of an organic functional layer structure 112 including two or more organic functional layer structure units 116, 120, the second organic functional layer structure unit 120 can be formed above or alongside the first functional layer structure units 116. An intermediate layer structure 118 can be formed electrically between the organic functional layer structure units 116, 120.

In various embodiments, the intermediate layer structure 118 can be formed as an intermediate electrode 118, for example in accordance with one of the configurations of the first electrode 110. An intermediate electrode 118 can be electrically connected to an external voltage source. The external voltage source can provide a third electrical potential, for example at the intermediate electrode 118. However, the intermediate electrode 118 can also have no external electrical connection, for example by the intermediate electrode having a floating electrical potential.

In various embodiments, the intermediate layer structure 118 can be formed as a charge generating layer structure 118 (charge generation layer CGL). A charge generating layer structure 118 may include one or a plurality of electron-conducting charge generating layer(s) and one or a plurality of hole-conducting charge generating layer(s). The electron-conducting charge generating layer(s) and the hole-conducting charge generating layer(s) can be formed in each case from an intrinsically conductive substance or a dopant in a matrix. The charge generating layer structure 118 should be formed, with respect to the energy levels of the electron-conducting charge generating layer(s) and the hole-conducting charge generating layer(s), in such a way that electron and hole can be separated at the interface between an electron-conducting charge generating layer and a hole-conducting charge generating layer. The charge generating layer structure 118 can furthermore have a diffusion barrier between adjacent layers.

Each organic functional layer structure unit 116, 120 can have for example a layer thickness of a maximum of approximately 3 µm, for example a layer thickness of a maximum of approximately 1 µm, for example a layer thickness of a maximum of approximately 300 nm.

The optoelectronic component 100 may optionally include further organic functional layers, for example arranged on or above the one or the plurality of emitter layers or on or above the electron transport layer(s). The further organic functional layers can be for example internal or external coupling-in/coupling-out structures that further improve the functionality and thus the efficiency of the optoelectronic component 100.

The second electrode 114 can be formed on or above the organic functional layer structure 112 or, if appropriate, on or above the one or the plurality of further organic functional layer structures and/or organic functional layers.

The second electrode 114 can be formed in accordance with one of the configurations of the first electrode 110, wherein the first electrode 110 and the second electrode 114 can be formed identically or differently. The second electrode 114 can be formed as an anode, that is to say as a hole-injecting electrode, or as a cathode, that is to say as an electron-injecting electrode.

The second electrode 114 can have a second electrical terminal, to which a second electrical potential can be applied. The second electrical potential can be provided by the same energy source as, or a different energy source than, the first electrical potential and/or the optional third electrical potential. The second electrical potential can be different than the first electrical potential and/or the optionally third electrical potential. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The second barrier layer 108 can be formed on the second electrode 114.

The second barrier layer 108 can also be referred to as thin film encapsulation (TFE). The second barrier layer 108 can be formed in accordance with one of the configurations of the first barrier layer 104.

Furthermore, it should be pointed out that, in various embodiments, a second barrier layer 108 can also be entirely dispensed with. In such a configuration, the optoelectronic component 100 may include for example a further encapsulation structure, as a result of which a second barrier layer 108 can become optional, for example a cover 124, for example a cavity glass encapsulation or metallic encapsulation.

Furthermore, in various embodiments, in addition, one or a plurality of coupling-in/-out layers can also be formed in the optoelectronic component 100, for example an external coupling-out film on or above the carrier 102 (not illustrated) or an internal coupling-out layer (not illustrated) in the layer cross section of the optoelectronic component 100. The coupling-in/-out layer may include a matrix and scattering centers distributed therein, wherein the average refractive index of the coupling-in/-out layer is greater than the average refractive index of the layer from which the electromagnetic radiation is provided. Furthermore, in various embodiments, in addition, one or a plurality of antireflection layers (for example combined with the second barrier layer 108) can be provided in the optoelectronic component 100.

In various embodiments, a close connection layer 122, for example composed of an adhesive or a lacquer, can be provided on or above the second barrier layer 108. By means of the close connection layer 122, a cover 124 can be closely connected, for example adhesively bonded, on the second barrier layer 108.

A close connection layer 122 composed of a transparent material may include for example particles which scatter electromagnetic radiation, for example light-scattering particles. As a result, the close connection layer 122 can act as a scattering layer and lead to an improvement in the color angle distortion and the coupling-out efficiency.

The light-scattering particles provided can be dielectric scattering particles, for example, composed of a metal oxide, for example, silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide. Other particles may also be suitable provided that they have a refractive index that is different than the effective refractive index of the matrix of the close connection layer 122, for example air bubbles, acrylate, or hollow glass beads. Furthermore, by way of example, metallic nanoparticles, metals such as gold, silver, iron nanoparticles, or the like can be provided as light-scattering particles.

The close connection layer 122 can have a layer thickness of greater than 1 µm, for example a layer thickness of a plurality of µm. In various embodiments, the close connection layer 122 may include or be a lamination adhesive.

The close connection layer 122 can be designed in such a way that it includes an adhesive having a refractive index that is less than the refractive index of the cover 124. Such an adhesive can be for example a low refractive index adhesive such as, for example, an acrylate having a refractive index of approximately 1.3. However, the adhesive can also be a high refractive index adhesive which for example includes high refractive index, non-scattering particles and has a layer-thickness-averaged refractive index that approximately corresponds to the average refractive index of the organic functional layer structure 112, for example in a range of approximately 1.7 to approximately 2.0. Furthermore, a plurality of different adhesives can be provided which form an adhesive layer sequence.

In various embodiments, between the second electrode 114 and the close connection layer 122, an electrically insulating layer (not shown) can also be applied, for example SiN, for example having a layer thickness in a range of approximately 300 nm to approximately 1.5 µm, for example having a layer thickness in a range of approximately 500 nm to approximately 1 µm, in order to protect electrically unstable materials, during a wet-chemical process for example.

In various embodiments, a close connection layer 122 can be optional, for example if the cover 124 is formed directly on the second barrier layer 108, for example a cover 124 composed of glass that is formed by means of plasma spraying.

Furthermore, a so-called getter layer or getter structure, for example a laterally structured getter layer, can be arranged (not illustrated) on or above the electrically active region 106.

The getter layer may include or be formed from a material that absorbs and binds substances that are harmful to the electrically active region 106. A getter layer may include or be formed from a zeolite derivative, for example. The getter layer can be formed as translucent, transparent or opaque and/or non-transmissive with respect to the electromagnetic radiation that is emitted and/or absorbed in the optically active region.

The getter layer can have a layer thickness of greater than approximately 1 µm, for example a layer thickness of a plurality of µm.

In various embodiments, the getter layer may include a lamination adhesive or be embedded in the close connection layer 122.

A cover 124 can be formed on or above the close connection layer 122. The cover 124 can be closely connected to the electrically active region 106 by means of the close connection layer 122 and can protect said region from harmful substances. The cover 124 can be for example a glass cover 124, a metal film cover 124 or a sealed plastics film cover 124. The glass cover 124 can be closely connected to the second barrier layer 108 or the electrically active region 106 for example by means of frit bonding (glass frit bonding/glass soldering/seal glass bonding) by means of a conventional glass solder in the geometric edge regions of the organic optoelectronic component 100.

The cover 124 and/or the close connection layer 122 can have a refractive index (for example at a wavelength of 633 nm) of 1.55.

FIGS. 2A-2G show schematic illustrations of a component in accordance with various embodiments.

The layers and/or structures of a component can have different values of an optical variable. FIGS. 2A-2G illustrate the values of an optical variable for the layers of an optoelectronic component in accordance with one of the configurations from the description of FIG. 1.

Figure 2A:
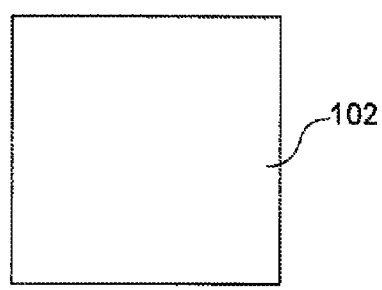
FIGS. 2A-2G show schematic illustrations of a component in accordance with various embodiments.
Figure 2B:
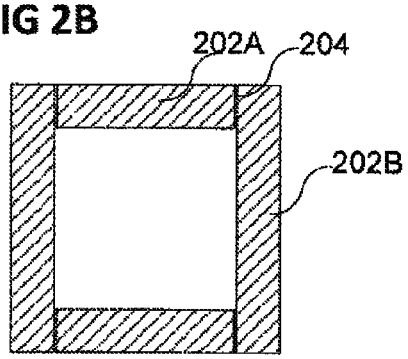
Figure 2C:
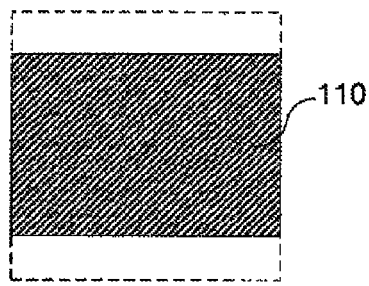
Figure 2D:
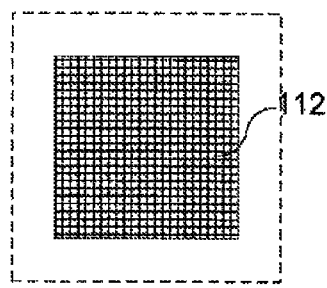
Figure 2E:
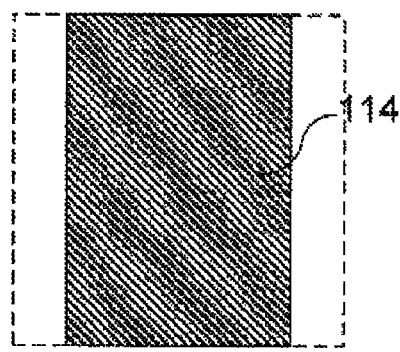
Figure 2F:
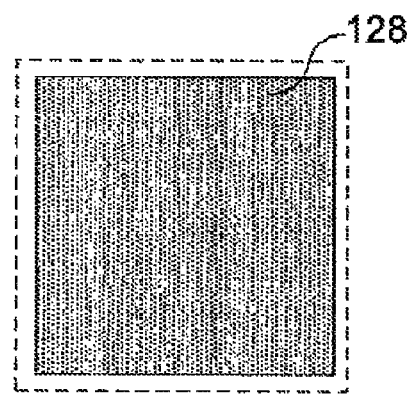

FIG. 2A illustrates a carrier 102 or a hermetically impermeable substrate. The carrier 102 can be transparent, for example.

A contact structure can be formed on or above the geometrical edge of the carrier 102; by way of example, the contact structure 202 may include two or more contact strips 202A, B and/or contact pads 202A, B. The contact structure can illustratively form the major dimensioning of the optically inactive region of the optically inactive component. The two or more contact strips can be electrically insulated from one another, for example by means of an insulating layer or a cavity (illustrated by means of the reference symbol 204 in FIG. 2B). The contact strips 202A, B can be designed for electrically connecting the optically active region. The two or more contact strips 202A, B can be connected to different electrodes of the component. The two or more contact strips 202A, B can be formed as a metal layer, for example a metallization layer.

The first electrode 110 (illustrated in FIG. 2C) and the second electrode 114 (illustrated in FIG. 2E) are formed on or above the carrier 102 (illustrated by means of the dashed line in FIGS. 2C, 2E) in such a way that they are in each case electrically connected to different contact strips 202A,B. In the region horizontally between the contact strips 202A, B, the organic functional layer structure is formed vertically between the electrodes 110, 114 (illustrated in FIG. 2D), such that said organic functional layer structure is electrically connected to the contact strips 202A, B by means of the electrodes 110, 114 and has no direct electrical connection to the contact strips 202A, B. The areal dimensioning of the organic functional layer structure 112 can illustratively form the major dimensioning of the optically active region.

An encapsulation structure 128, for example a thin-film encapsulation and/or an adhesively bonded cover, for example a laminating glass, can be formed above the second electrode 114. The encapsulation structure 128 can be formed in such a way that a region of the contact strips 202A, B is exposed (illustrated in FIG. 2F), by means of which region electrical contacting of the component is made possible.

The abovementioned structures can each have a different value of the optical variable. By virtue of the fact that the structures mentioned are formed in different regions on or above the carrier, a component 210 that is inhomogeneous with regard to the optical variable is formed by means of superposition of the values of the optical variable of the individual structures (illustrated in FIG. 2G). By way of example, the component can thereby have a transparency deviating from the optically active region in the region of the corners of the component and/or the contact metallization or the contact strips.

The inhomogeneous component 210 has regions having different values of the optical variable.

Figure 3A:
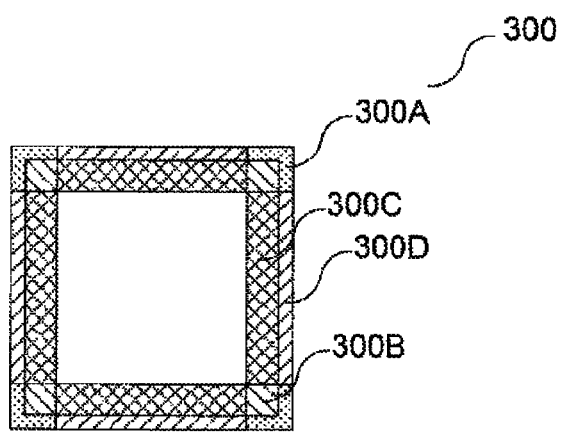
FIGS. 3A-3C show schematic illustrations of optoelectronic components in accordance with various embodiments.
Figure 3B:
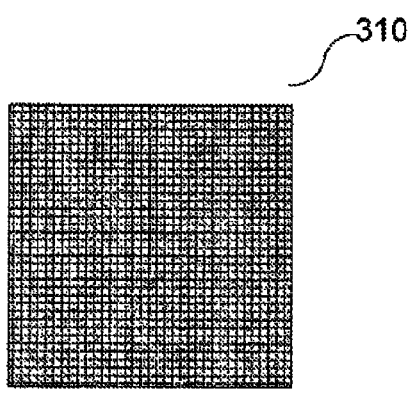
Figure 3C:
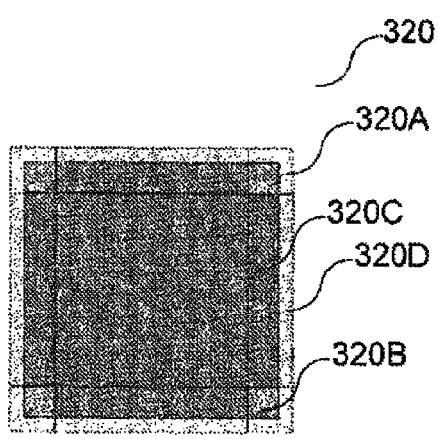

FIGS. 3A-3C show schematic illustrations of optoelectronic components in accordance with various embodiments.

An adaptation structure 300 (illustrated in FIG. 3A) can be integrated on, above and/or in the inhomogeneous component. The adaptation structure 300 may include different adaptation regions 300A-D designed depending on the values of the optical variable of the inhomogeneous component, for example the lateral distribution thereof in the optically active region and optically inactive region (also see description of FIGS. 4A and 4B). Furthermore, FIG. 3A illustrates that the value of the optical variable can be a distribution of values of the optical variable.

Figure 2G:
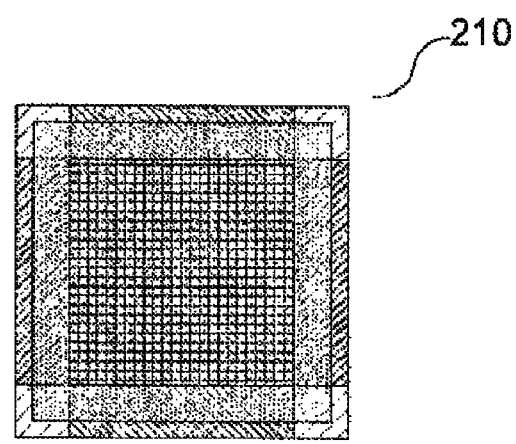

By means of adding the adaptation structure 300 to the inhomogeneous component 210, it is possible to form a component whose value of the optical variable is homogeneous over the optically active region and the optically inactive region (illustrated in FIG. 3B), or the difference between the value of the optical variable in the optically inactive region and the value of the optical variable in the active region is at least reduced (illustrated in FIG. 3C—cf. also with FIG. 2G).

Figure 5A:
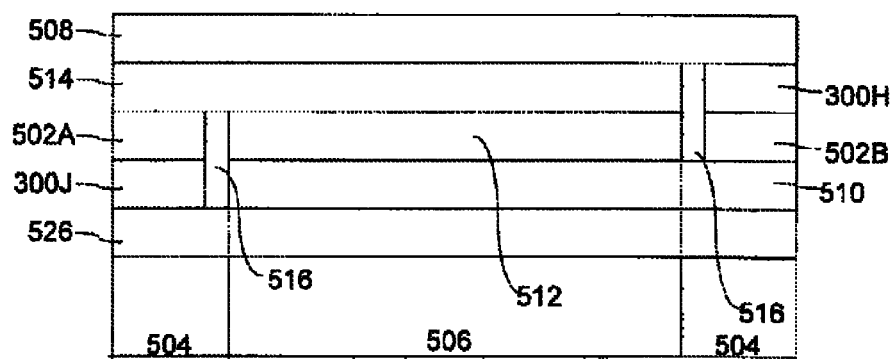
FIGS. 5A, 5B show schematic illustrations of components in accordance with various embodiments.
Figure 5B:
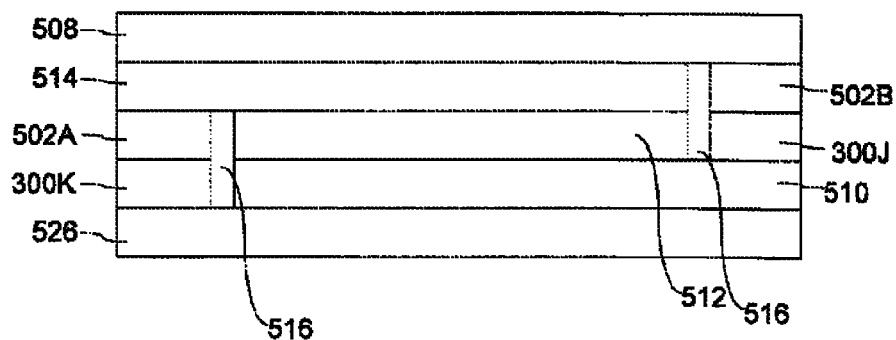

The adaptation structure may include different adaptation regions 300A-G (illustrated in FIGS. 4A, 4B; FIGS. 5A, 5B).

The optically inactive region can have structures and/or layers which are not formed in the optically active region and in the case of which it is not expedient to form them in the optically active region, for example the areal dimensioning of the contact structure.

In one embodiment, the adaptation structure 300 may include one or a plurality of adaptation region(s) 300A-D having structures and/or layers which are formed in the optically active region and are not formed in the optically inactive region (illustrated in FIG. 4A). In this case, by means of the adaptation structure 300, the difference between the value of the optical variable of the optically active region and the value of the optical variable in the optically inactive region can be reduced (see FIG. 3C, for example). By way of example, the adaptation structure may include a first adaptation region 300A, i.e. a plurality of supplementary regions at the corners on/above/below the carrier 102 or the substrate 126. Furthermore, the adaptation structure may include a second adaptation region 300B, i.e. a plurality of supplementary regions laterally between the corners and the electrodes on/above/below the carrier 102 or the substrate 126. Furthermore, the adaptation structure may include a third adaptation region 300C, i.e. a plurality of supplementary regions on/above/below the electrodes, for example in the optically inactive region. Furthermore, the adaptation structure may include a fourth adaptation region 300D, i.e. a plurality of supplementary regions on/above/below the lamination edges, without the regions of the corners. The optically active region differs from the optically inactive region with adaptation structure in this case with regard to the optical variable essentially by the value of the structure(s) which is/are formed in the optically inactive region and not formed in the optically active region, for example in the form of contact strips in the optically inactive region.

In one embodiment, the adaptation structure 300 may include one or a plurality of adaptation region(s) 300E-G formed in such a way that they adapt the value of the optical variable of the optically inactive region to the value of the optical variable of the optically active region (see FIG. 3B, for example). The adaptation regions 300E-G may include other substances, other layer thicknesses; regions in which individual layers are formed in a structured fashion, and/or cavities, compared with the layers of the optically active region (illustrated in FIG. 4B). By way of example, the adaptation structure may include a first adaptation region 300E, i.e. supplementary region, which is arranged on/above/below the lamination edge of the carrier 102 or the substrate 126, for example the lamination glass edge in the case of a glass carrier. Furthermore, the adaptation structure may include a second adaptation region 300F, i.e. a plurality of supplementary regions at the corners on/above/below the carrier 102 or the substrate 126. Furthermore, the adaptation structure may include a third adaptation region 300G, i.e. a plurality of supplementary regions on/above/below the contact pads. In this case, the adaptation structure 300 can have a layer structure that deviates from the layer structure of the optically active region, for example in the layer thicknesses of individual layers and/or the material composition of layers. The adaptation of the value of the optical variable of the optically inactive region to the value of the optical variable of the optically active region can be effected by means of the combination of the plurality of adaptation regions 300E-G in total. As a result, a component can be realized which has only a small difference with regard to the value of the optical variable in the optically inactive region and in the optically active region (also see FIG. 3B, for example).

In one embodiment, for example, the transparency of the optically inactive region of an organic light emitting diode, for example in according with one of the configurations from the description of FIG. 1, can be adapted to the transparency of the optically active region, for example by means of an adaptation structure 300 in accordance with the description of FIG. 4B. The transparency of the optically inactive region and of the optically active region can be coordinated with one another by the transparency of the individual adaptation regions 300E-G being coordinated with one another. In this case, it should be taken into consideration that one or a plurality or electrode(s), for example the cathode, projects over a part of the contact structure 202A, B, i.e. wets the latter, such that the adaptation structure on/above/in the contact structure 202A, B includes at least two different regions.

In order to be able to realize an organic light emitting diode 100 having homogeneous transparency, adaptation structures are required in/on/above different regions of the substrate, for example at the corners, on the lamination glass edge, on the contact regions (also see description of FIG. 4B).

Furthermore, a coordination of the individual transparency of the materials with one another may be necessary in order to be able to obtain a homogeneous overall impression. By way of example, the adaptation structure 300E, G in/above/on the contact structure 202A, B and/or the adaptation structure 300F in/above/on the corner supplementation may be well suited to readjusting the transparency of the optically inactive region.

Different materials having a different transparency may be appropriate as materials for the individual adaptation structure 300E-G:

In one configuration, an adaptation region or an adaptation structure may include one or a plurality of thin AgMg layer(s) having a thickness of an individual layer or a total thickness of a plurality of AgMg layers of a maximum of approximately 20 nm.

In one configuration, an adaptation region or an adaptation structure may include one or a plurality of thin Ag layer(s) having a thickness of an individual layer or a total thickness of a plurality of Ag layers of a maximum of approximately 20 nm.

In one configuration, an adaptation region or an adaptation structure may include one or a plurality of thin GeAg layer(s) having a thickness of an individual layer or a total thickness of a plurality of GeAg layers of a maximum of approximately 20 nm.

In one configuration, an adaptation region or an adaptation structure may include one or a plurality of thin Ag nanowire layer(s) having a thickness of an individual layer or a total thickness of a plurality of AgMg layers of a maximum of approximately 1000 nm.

In one configuration, an adaptation region or an adaptation structure may include one or a plurality of thin metal layer(s), and/or transparent conductive oxides (p-type and/or n-type) for example ITO, ZnO, a delafossite. In other words: in one configuration, an adaptation region or an adaptation structure may include a stack of at least one thin metal layer and/or transparent conductive oxides, for example ITO+Ag+ITO.

In one configuration, an adaptation region or an adaptation structure may be formed form a TCO, for example ITO, or include a TCO in such a way that the transparency or the translucency of the optically inactive region is adapted to the transparency or the translucency of the optically active region by means of the thickness of the adaptation structure. Conversely, the transparency or translucency of the optically active region can also be adapted to the transparency or the translucency of the optically inactive region. Alternatively, the adaptation structure may include or be formed from a different suitable transparent conductive material. By way of example, the adaptation structure can be formed as an electrically conductive frame, as described in detail further below.

In one configuration, an adaptation region or an adaptation structure at the edge of the component may also include or be formed from electrically insulating (nonconductive) materials such as oxides, nitrides and/or further semitransparent materials.

FIGS. 5A, 5B show schematic illustrations of components in accordance with various embodiments.

The component 500 illustrated in FIGS. 5A, 5B can be formed as a electro-optical component or an optoelectronic component 100, for example in accordance with one of the configurations described above. The component 500 includes on or above a substrate 526, for example in accordance with one of the above-described configurations of the carrier 102 or of the hermetically impermeable substrate 126, a first electrode 510, for example in accordance with one of the above-described configurations of the first electrode 110; a second electrode 514, for example in accordance with one of the above-described configurations of the second electrode 114; an encapsulation 508, for example including an above-described thin-film encapsulation 108 and/or adhesively bonded cover 124; and an optically active structure 512.

In various embodiments, the optically active structure 512 can be formed as an organic functional layer structure 512, for example in accordance with an organic functional layer structure 112 described above.

In various embodiments, the optically active structure 512 can be formed as a cavity structure 512, for example including electrically polarizable particles in liquid-filled cavities. The polarizable particles can change their position, distribution and/or alignment in the liquid-filled cavities by means of an applied electric field and can thereby electrically alter the optical properties of the electro-optical component.

In various embodiments, adaptation regions 300H, J of the adaptation structure 300 (illustrated in FIGS. 5A, 5B for the adaptation regions 300H, J, K) can be formed in an electrically conductive fashion. The electrically conductive adaptation regions 300H, J of an adaptation structure 300 can be formed on and/or below a contact structure 502A, B, for example one contact strip, a plurality of contact strips, one contact pad and/or a plurality of contact pads.

The adaptation structure 300 including electrically conductive adaptation regions can be electrically insulated by means of electrically insulating structures 516 for example with respect to the optically active structure 512 and/or one or a plurality of electrodes 510, 514. The electrically insulating structure 516 can for example be formed as a cavity and/or include an electrically insulating substance, for example a polyimide.

In various embodiments, adaptation regions 300K of the adaptation structure 300 can be formed in an electrically insulating fashion. The electrically insulating adaptation regions 300K of an adaptation structure 300 can be formed on and/or below a contact structure 502A, B, for example one contact strip, a plurality of contact strips, one contact pad and/or a plurality of contact pads. The dielectric adaptation region 300K should be formed in such a way that the current path between contact structure 502A, B and electrodes 110, 114 is not interrupted electrically; or is formed as an electrical capacitance or as a capacitor.

The adaptation structure 300 can be formed in such a way that it is integrated, for example monolithically integrated, with the optically inactive region 504 and/or the optically active region 506 on a carrier 102 or substrate 126. By way of example the adaptation structure 300 with the optically active region 506 and/or the optically inactive region 504 can be encapsulated by means of a common encapsulation, for example be covered or surrounded by a thin-film encapsulation 108 or cover.

The optically active region 506 and/or the optically inactive region 504 can in each case form a continuous structure or a continuous region or have two or more regions or structures separated from one another.

Figure 6:
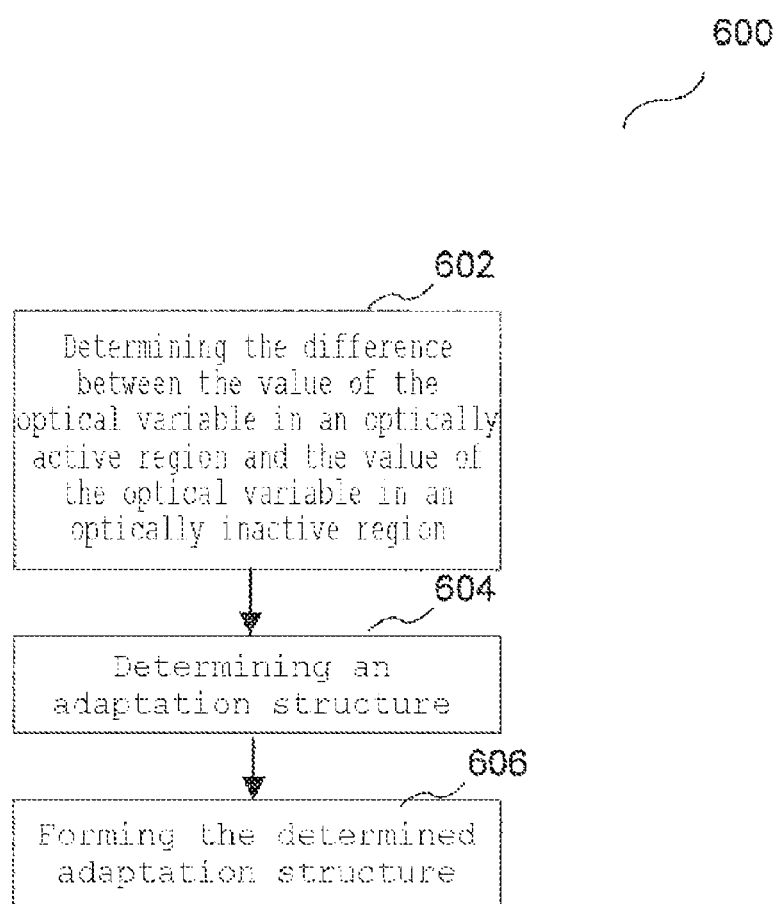
FIG. 6 shows a diagram concerning a method in accordance with various embodiments.

FIG. 6 shows a diagram concerning a method in accordance with various embodiments.

The method 600 for producing a component described above includes determining 602 the difference between a value of an optical variable in an optically active region and a value of the optical variable in an optically inactive region.

Determining 602 the difference may include determining the value of the optical variable in the optically active region.

Furthermore, determining 602 the difference may include determining the value of the optical variable in the optically inactive region.

Determining 602 the difference may include measuring and/or calculating the value of the optical variable of the optically active region and/or the optically inactive region.

Determining the value of the optical variable of the optically active region and/or the optically inactive region may include detecting a plurality of measurement values. The plurality of measurement values can be detected at locally different regions of the optically active region and/or of the optically inactive region. The plurality of measurement values of the transmitted, emitted and/or reflected electromagnetic radiation can have different wavelength spectra, different polarizations, different intensities and/or different angles of incidence on the optoelectronic component.

By way of example, firstly the value of the optical variable, for example the wavelength-dependent transparency $T(\lambda)$, of the optically active region and of the optically inactive region can be determined. By way of example, for an organic light emitting diode (as value of the optical variable) for all components of the organic light emitting diode depending on the position xy on the component, $T(\lambda)$ is determined ($T_{xy}(\lambda)$), for example for the optically active region with electrodes, the contact pads and further regions.

Afterward, it is possible to determine, for example calculate, what additional wavelength-dependent absorption $A_{xy\text{-}adaptation}(\lambda)$ is necessary in order to adapt the transparency of all components $T_{xy}(\lambda)$ to the region having the lowest transparency $T_{min}(\lambda)$:

$$T_{xy\text{-}adaptation}(\lambda) = \frac{T_{min}(\lambda)}{T_{xy}(\lambda)},$$

and $$A_{xy\text{-}adaptation}(\lambda) = 1 - T_{xy\text{-}adaptation}(\lambda).$$

Furthermore, the method includes determining 604 an adaptation structure on the basis of the determined difference in such a way that the value of the optical variable in the optically inactive region is adapted to the value of the optical variable in the optically active region.

Furthermore, determining 604 the adaptation structure may include selecting a material of a layer of the adaptation structure.

Furthermore, determining 604 the adaptation structure may include selecting the position of a layer of the adaptation structure in the beam path through the optically active region and/or the optically inactive region.

Furthermore, determining 604 the adaptation structure may include selecting a lateral position of a layer and/or structuring a layer of the adaptation structure in the adaptation structure.

An adaptation structure—for example in the embodiment mentioned above—from a list of materials one material or a combination of materials can be selected as the adaptation structure in order to be able to realize $A_{xy\text{-}adaptation}(\lambda)$, for example:

one or a plurality of thin AgMg layer(s), having a maximum thickness of approximately 20 nm;
one or a plurality of thin Ag layer(s), having a maximum thickness of 20 nm;
one or a plurality of thin GeAg layer(s), having a maximum thickness of 20 nm;
one or a plurality of thin Ag nanowire layer(s), up to 1000 nm;
generally one or a plurality of thin metal layer(s);
one or a plurality of thin transparent conductive oxides, for example ITO, ZnO;
a stack of thin metal layers and/or transparent conductive oxides, for example ITO+Ag+ITO;
for the adaptation regions at the edge of the component also nonconductive oxide or nitride compounds; and/or
further semitransparent or semitranslucent materials.

Furthermore, when determining 604 the adaptation structure depending on the material configuration of the adaptation structure, it is possible to select that location on the component at which the material is arranged in the component (also see FIGS. 5A and 5B with description). By way of example, the adaptation structure can be integrated in the component, i.e. in the optically active region and/or the optically inactive region, and/or be applied thereto. By way of example, electrically conductive materials (for example materials mentioned above, disregarding the nonconductive oxide or nitride compounds and further semitransparent or semitranslucent materials) can be arranged on or below the contact structure, for example on or below contact strips and/or contact pads.

Electrically insulating (nonconductive) materials can be formed, for example deposited, below the contact pads.

Both variants mentioned above can be chosen in optically and/or electrically nonfunctional regions, for example the insulated corners.

Furthermore, the method includes forming 606 the determined adaptation structure in/on/above/below the optically inactive region and/or optically active region in such a way that the value of the optical variable in the optically inactive region is adapted to the value of the optical variable in the optically active region.

The adaptation structure can be formed in an integrated fashion in the optically active region and/or in the optically inactive region for example by virtue of the fact that the adaptation structure and the optically active region and/or the optically inactive region are formed on or above a common carrier and/or have a common encapsulation. Forming an encapsulation may include forming a thin-film encapsulation and/or applying a self-supporting cover.

The adaptation structure can be formed with one or a plurality of layers. The one layer or the plurality of layers can form different adaptation regions, for example by the one layer or the plurality of layers being formed in a structured fashion. The plurality of layers of the adaptation structure can for example be formed in each case from different materials and thus have in each case different values of the optical variable and/or different influences on the optical variable. A different influence can be, for example, a different sign direction upon the value of the optical variable being changed, i.e. increase or decrease the values; and/or change the value to different extents, for example increase a value of the optical variable by a factor of 1.2 or a factor of 12.

One layer or a plurality of layers of the adaptation structure can be formed in a laterally structured fashion.

In various embodiments, the adaptation structure can be formed at least partly on, above and/or in the optically active region. Furthermore, the adaptation structure can be formed at least partly on, above and/or in the optically inactive region. Furthermore, the adaptation structure can be formed at least partly on, above and/or in the carrier and/or the encapsulation.

In various embodiments, the adaptation structure can be formed in such a way that it has at least partly the layer structure of the optically active region of which the optically inactive region is free.

In various embodiments, the layer structure of the adaptation structure can be formed in an optically inactive fashion or be formed in an electrically insulated fashion with regard to the electrical connection of the optically active region.

In various embodiments, the adaptation structure can be formed from a wavelength-converting material with respect to the electromagnetic radiation.

In various embodiments, the adaptation structure, with respect to the electromagnetic radiation may include or be formed in a manner including scattering particles distributed in a matrix.

In various embodiments, the adaptation structure, with respect to the electromagnetic radiation, may include or be formed in a manner including refractive-index-changing and/or color-changing nanoparticles distributed in a matrix.

In various embodiments, the adaptation structure, with respect to the electromagnetic radiation, may include an optically anisotropic substance, be formed therefrom and/or be formed in such a way, for example be formed in a birefringent fashion.

In various embodiments, the adaptation structure may include or be formed from a getter with respect to water and/or oxygen.

In various embodiments, the adaptation structure can be formed at least regionally in an electrically conductive fashion.

In various embodiments, the adaptation structure can be formed at least regionally in an electrically insulating fashion or in an electrically insulated fashion.

In various embodiments, the adaptation structure can be formed above and/or below a contact pad.

In various embodiments, the adaptation structure can be formed in an adhesion-reinforcing fashion and/or in a cohesion-reinforcing fashion with respect to the structure of the optically inactive region without an adaptation structure.

In various embodiments, the adaptation structure can be formed as a shield with respect to electromagnetic radiation, for example with respect to UV radiation.

In various embodiments, the adaptation structure can be formed in such a way that the value of the optical variable of the optically active region and the value of the optical variable of the optically inactive region are adapted to a predefined value.

In various embodiments, the adaptation structure can be formed in such a way that the value of the optical variable of the optically active region and the value of the optical variable of the optically inactive region have a difference of less than approximately 10% with regard to the value of the optical variable of the optically active region.

In various embodiments, the adaptation structure can be formed in such a way that predefined information is represented, for example in the form of a frame or passepartout.

In various embodiments, the adaptation structure can be formed in such a way that the optically inactive region with the adaptation structure is formed in a beam shaping fashion for transmitted and/or reflected electromagnetic radiation, for example in a diffusely reflective fashion.

Depending on the specific configuration of the respective adaptation region of the adaptation structure, the adaptation structure can be formed, depending on the location on the component, for example by means of a mask coordinated with the design; by way of example, the material of an adaptation region can be applied, introduced by vapor deposition, introduced by spincoating, introduced by printing and/or introduced by spraying.

The component, i.e. the stack of layers, can be produced with the adaptation structure determined, such that the adaptation structure is integrated.

Furthermore, the method may include forming the optically active region before the difference is determined 602. However, the optically active region can also be formed after the difference has been determined, for example in the case of a component of the same design. As a result, at least one adaptation region of the adaptation structure can be integrated in the optically active region. The optically active region can be designed for electrically controllably transmitting, reflecting, absorbing, emitting and/or converting electromagnetic radiation.

Furthermore, the method may include forming an optically inactive region before the difference is determined 602. However, the optically inactive region can also be formed after the difference has been determined for example in the case of a component of the same design. As a result, at least one adaptation region of the adaptation structure can be integrated in the optically inactive region.

The optically active region and the optically inactive region can be formed alongside one another; by way of example, the optically inactive region can be formed in the geometrical edge region of the component on or above the carrier, while the optically active region is formed centrally on or above the carrier; and vice versa.

Furthermore, the method may include providing a carrier, wherein the optically active region and the optically inactive region are formed on the carrier. The optically active region and the optically inactive region can be formed as different regions on the carrier.

Furthermore, the method may include forming an encapsulation, wherein the encapsulation is formed in such a way that the optically active region, the optically inactive region and/or the adaptation structure are hermetically sealed with respect to at least water and/or oxygen. The encapsulation can be formed or designed with a hermetically impermeable carrier, a hermetically impermeable thin-film encapsulation and/or a hermetically impermeable cover.

In various embodiments, the optically active region can be formed with a first electrode, a second electrode and an organic functional layer structure, wherein the organic functional layer structure is formed between the first electrode and the second electrode and wherein the organic functional layer structure is designed for emitting the electromagnetic radiation and/or converting the electromagnetic radiation into an electrical current and/or an electrical voltage. Furthermore, at least one intermediate electrode can be formed between the first electrode and the second electrode, wherein the at least one intermediate electrode is formed between the first electrode and the second electrode.

In various embodiments, the optically active region can be formed with a first electrode, a second electrode and a cavity structure, wherein the cavity structure is formed between the first electrode and the second electrode and wherein the cavity structure is designed for electrically controllably transmitting, reflecting and/or absorbing the electromagnetic radiation. The cavity structure can be formed in such a way that it includes electrically polarizable particles in liquid-filled cavities.

In various embodiments, the optically active region can be formed with a plurality of optically active regions. The plurality of optically active regions can be formed in such a way that they differ in at least one value of an optical variable with respect to the electromagnetic radiation. The plurality of optically active regions can be formed such that they are drivable independently of one another at least in part.

In various embodiments, the optically inactive region can be formed with an electrically conductive contact structure, wherein the electrically conductive contact structure is designed for forwarding a current for energizing the optically active region. The contact structure can be formed with at least one contact pad and/or at least one electrical busbar. The optically inactive region can be formed in an edge region of the component. The optically inactive region can be formed for example in a manner surrounded at least partly by the optically active region, for example as an electrical busbar within the optically active region.

In various embodiments, the component can be formed as a surface component having a planar optically active region.

In various embodiments, the component may include an electro-optical component, for example an electrically switchable optical filter, an electrically switchable mirror; and/or a optoelectronic component, for example an organic light emitting diode, a display, a photosensor and/or a solar cell; or can be formed in such a way.

By means of the method, it is possible to form for example an optoelectronic component having an adaptation structure, for example an organic light emitting diode having an adaptation structure.

Figures 7A, 7B:
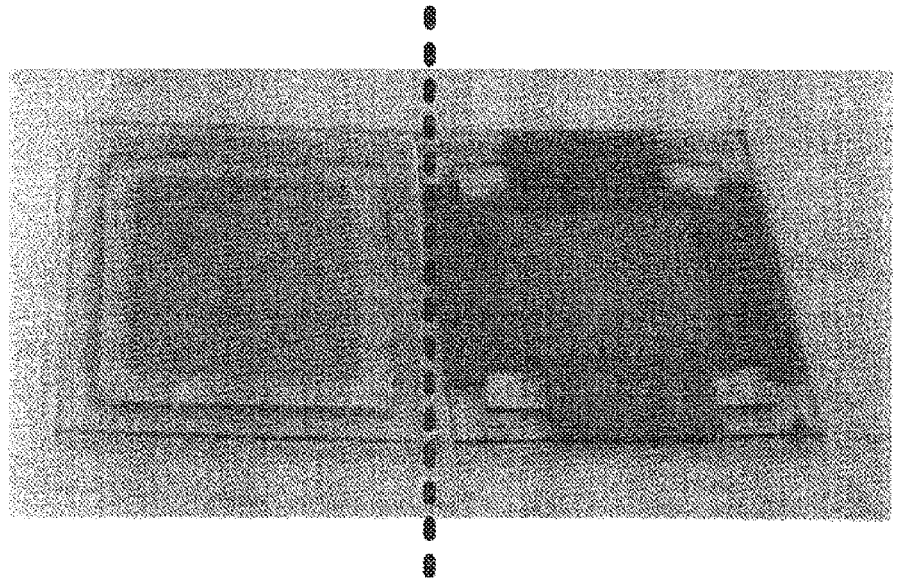
FIGS. 7A and 7B show an illustration of an optoelectronic component in accordance with various embodiments and a conventional optoelectronic component.

In comparison with a conventional organic light emitting diode (FIG. 7B) having metallically lustrous or reflective contacts, an organic light emitting diode having an adaptation structure (FIG. 7A) includes fully transparent contacts, as is evident from the comparison photographs in FIGS. 7A and 7B.

In various embodiments, a component and a method for producing a component are provided which make it possible to form a component having an optical variable that is more homogeneous laterally. As a result, with the component it is possible to reproduce information with a smaller deviation with respect to the information to be represented. Furthermore, it is thereby possible to realize an OLED having a more homogeneous transparency and/or reflectivity, for example to enable an OLED having an esthetically higher-quality impression in conjunction with homogeneous transparency without edge metallization.

Figure 8A:
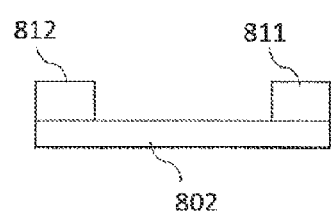
FIGS. 8A,8C,8E show schematic cross-sectional views of optoelectronic components in a method for producing an optoelectronic component.
Figure 8B:
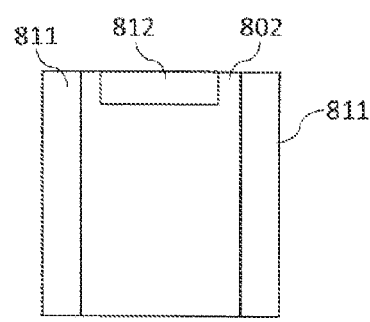
FIGS. 8B,8D,8F show schematic plan views of optoelectronic components in a method for producing an optoelectronic component.
Figure 8C:
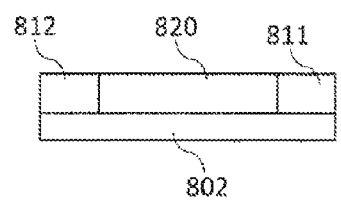
Figure 8D:
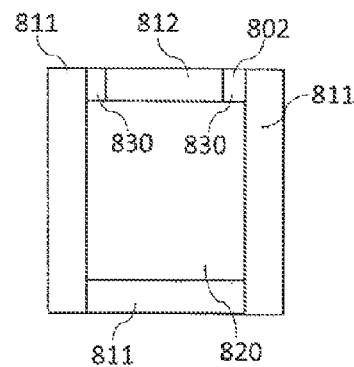
Figure 8E:
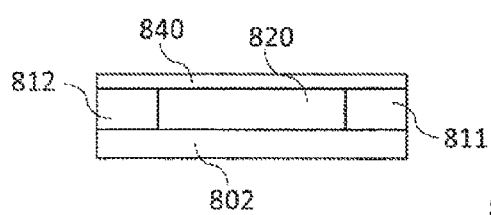
Figure 8F:
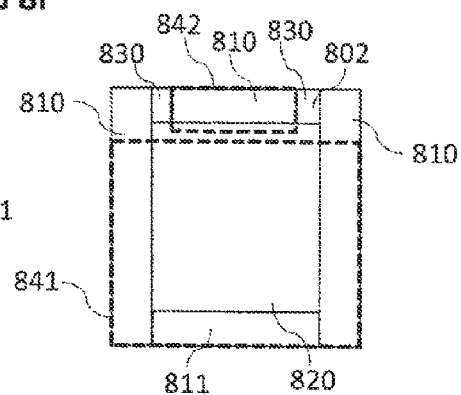
Figure 8G:
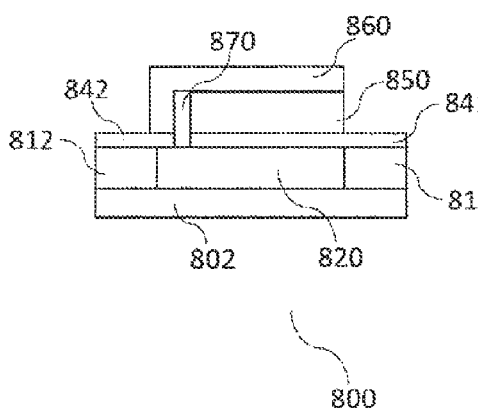
FIG. 8G shows a schematic cross-sectional view of an optoelectronic component in accordance with various embodiments.

FIG. 8G shows a component 800 that can be formed as an optoelectronic component 100. The component 800 includes a carrier 802, which can be formed in accordance with one of the above-described configurations of the carrier 802 or of the hermetically impermeable substrate 126. The carrier 802 can have the shape of a rectangle in a plan view, for example illustrated in FIG. 8B.

Figure 8H:
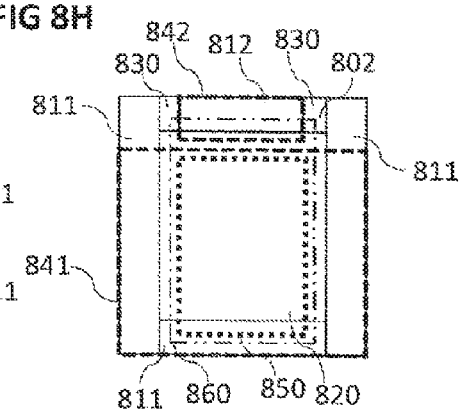
FIG. 8H shows a schematic plan view of an optoelectronic component in accordance with various embodiments.

The component 800 furthermore includes an optically active region 850 having a first electrode 841, a second electrode 860 and an organic functional layer structure 850, wherein the organic functional layer structure 850 is arranged between the first electrode 841 and the second electrode 560. The organic functional layer structure 850 is illustrated by means of the dotted line in FIG. 8H. The organic functional layer structure 850 can be formed in accordance with one embodiment of the organic functional layer structure 112 as described thoroughly further above.

The first electrode 841 can be formed in accordance with a configuration of the first electrode 110 as described further above. The second electrode 860, illustrated by means of the dashed-dotted line in FIG. 8H, can be formed in accordance with an above-described configuration of the second electrode 114. The optically active region can be formed in accordance with an above-described configuration of the optically active region 506.

The component 800 furthermore includes an optically inactive region, which is arranged alongside the optically active region. The optically inactive region can be free of the first electrode 841 and/or the second electrode 860. The optically inactive region can be free of the organic functional layer structure 850. The optically inactive region can be formed in accordance with a configuration of the above-described optically inactive region 504.

The component 800 furthermore includes an electrically conductive frame formed from a transparent conductive material. The electrically conductive frame can be formed from a transparent conductive oxide or some other suitable transparent conductive material. The electrically conductive frame is formed on the carrier 802. The electrically conductive frame includes a first frame element 811 and a second frame element 812, which partly surround the optically active region. By way of example, the electrically conductive frame can form a frame around the optically active region in a plan view, for example illustrated in FIG. 8D. The electrically conductive frame can be formed in an edge region of the carrier 802, for example illustrated in FIG. 8A. The first frame element 811 can have the shape of a rectangle. A side of the first frame element 811 can have the same length as a side of the carrier 802. The first frame element 811 can be formed along a side of the carrier 802. The first frame element 811 may include further first frame elements 811. The first frame element 811 may include two first frame elements 811, for example shown in FIG. 8B. By way of example, the two first frame elements 811 are formed along two mutually opposite sides of the carrier 802. The first frame element 811 may include three first frame elements 811, for example shown in FIG. 8B. The three first frame elements 811 can be formed in each case along three different sides of the carrier 802. The three first frame elements 811 can be electrically conductively connected to one another. The second frame element 812 can be formed along a side of the carrier 802 that is free of the first frame element 811. A spacing 830 can be arranged along a side of the carrier 802. The spacing 830 can be formed in a manner free of first frame element 811 and second frame element 812 in such a way that an electrical short circuit is prevented during contacting of the first frame element 811 and the second frame element 812.

The component 800 may further include a current distribution layer 840. The current distribution layer 840 is formed on the electrically conductive frame and on or above the carrier 802. The current distribution layer 840 can serve for lateral current distribution in the component 800. The current distribution layer 840 may include a first current distribution region 841 and a second current distribution region 842. The first current distribution region 841 can be formed as the first electrode 841. The organic functional layer structure 850 and the first frame element 811 can be connected to one another by means of the first current distribution region 841. The first electrode 841 is arranged on or above the carrier 802 in such a way that it partly covers the optically active region. The first electrode 841 is connected, for example electrically conductively connected, to the first frame element 811. The second electrode 860 is connected to the second frame element 812. The second current distribution region 842 can be arranged on the second frame element 812. The second current distribution region 842 can be electrically conductively connected to the second frame element 812 and the second electrode 860. The second electrode 860 can have a lateral region and a vertical region, wherein the lateral region is formed on the organic functional layer structure 850 and wherein the vertical region electrically conductively connects the second current distribution region 842 to the lateral region. The vertical region of the second electrode 860 can be arranged at a distance from the organic functional layer structure 850 in such a way that a hollow space 870 is situated between the organic functional layer structure 850 and the vertical region. The hollow space 870 can be filled with an electrically insulating substance and/or an inert gas. The first current distribution region 841 can be formed as an anode and the second electrode can be formed as a cathode. The current distribution layer 840 can be formed from the same substance or substance mixture as the electrically conductive frame.

Figure 11:
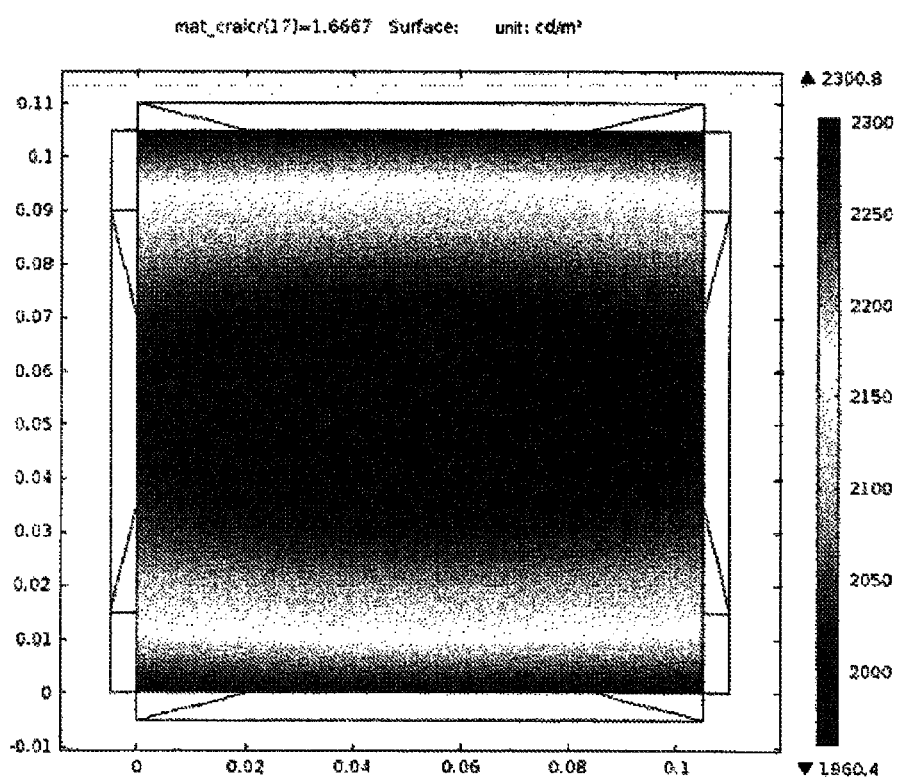
FIG. 11 shows a graphical illustration of a simulation of a luminance distribution of an optoelectronic component in accordance with various embodiments.

In various embodiments, the electrically conductive frame and the first electrode 841 may include or be formed from indium tin oxide. The electrically conductive frame and the first electrode 841 may also include or be formed from other suitable transparent conductive oxides. The electrically conductive frame can be formed in such a way that it has a sheet resistance of less than 2 ohms/sq. By way of example, an electrically conductive frame which is formed from ITO and has a layer thickness of 1200 nm has a sheet resistance of approximately 1.25 ohms/sq and a transmission of 0.28. A table of the simulated transmission of ITO depending on the sheet resistance and on the layer thickness is illustrated in FIG. 10. Furthermore, FIG. 9 shows a simulation of the luminance distribution of a component. The indications in the table in FIG. 9 relate to a simulation model which is shown in FIG. 11 and relates to the effects of a conductivity in the edge region of the OLED. By way of example, a uniformity of 92% results given a conductivity of 0.3667 S*sq. Said uniformity is calculated from the brightness at the point of minimum luminance (MIN) and the brightness at the point of maximum luminance (MAX) by means of the following formula: 1−((MAX−MIN/MAX+MIN)). In this case, MIN and MAX are determined by a simulation tool in the model from FIG. 11. The deviation of the respective value with respect to a given reference is designated as Difference with respect to reference in the table in FIG. 9. FIG. 11 shows a graphical representation of a simulation of the luminance distribution of a component in accordance with various embodiments, the electrically conductive frame of which is formed from ITO. FIG. 11 illustrates the luminance, in $cd/m^2$, given a conductivity of the electrically conductive frame of 0.6 ohms/sq as a function of the x- and y-coordinates of the component. It is evident from this that a component 800 even without metallic contacts can be realized with a homogeneous luminous field.

In various embodiments, an optically functional layer 820 can be arranged between the first frame element 811 and the second frame element 812.

In various embodiments, the optically functional layer 820 can be a scattering layer. The scattering layer, furthermore also designated as internal light coupling-out layer, can serve for improving the light coupling-out efficiency. The scattering layer may include scattering particles, as described further above. The scattering layer can be formed in a reflective fashion.

In various embodiments, the first current distribution region 841 can be arranged on the first frame element 811 and the optically functional layer 820.

In various embodiments, the organic functional layer structure 850 can be arranged on the first current distribution region 841 in such a way that it is arranged above the optically functional layer 820 and in regions free of the electrically conductive frame. The second electrode 860 can be arranged on the organic functional layer structure 850 in such a way that it is arranged above the optically functional layer 820 and in regions free of the electrically conductive frame. Such an arrangement affords tolerances with regard to the dimensions of individual regions of the component 800, as a result of which short circuits can be avoided.

In various embodiments, an adaptation structure formed in accordance with an above-described embodiment of the adaptation structure 300 can be arranged in the component 800. By way of example, the adaptation structure can be arranged on or above the electrically conductive frame, the optically functional layer 820, the current distribution layer 840 and/or the second electrode 860.

In the case of a reflective scattering layer and an at least translucent optically inactive region, the adaptation structure can be formed only in the optically inactive region. The adaptation structure can be designed to adapt regions in the optically inactive region which have a different translucency to one another with regard to their translucency.

Free-standing luminous areas on a substrate without metallic contacts can be realized by a very thick and thus highly conductive ITO layer being deposited in the outer, optically inactive region, in which the metallization is normally applied. It is possible to deposit ITO having significantly higher layer thicknesses in the optically inactive region, without adversely influencing the efficiency of the OLED in this case, compared with in the optically active region.

In this case, despite the higher thickness of the OLED, there is still a very high transparency for the eye. The ITO thus has, as viewed over the lateral extent of the component, regions having different layer thicknesses. The transitions between the regions having different thicknesses can be discrete or gradual. This affords the advantage of new design freedoms for the OLED application, since metallic nontransparent regions are no longer required outside the optically active OLED luminous area. Fully transparent OLED components having transparent electrodes without nontransparent regions as a result of metallic contacts can also be realized as a result.

FIG. 8A to FIG. 8H show the component 800 in a method for producing the component 800.

The method for producing the component 800 includes providing a carrier 802, wherein the carrier 802 is formed in accordance with an embodiment described above. Furthermore, the method includes forming an optically active region. Forming the optically active region includes forming a first electrode 841, a second electrode 860 and an organic functional layer structure 850, wherein the organic functional layer structure 850 is arranged between the first electrode 841 and the second electrode 860. Furthermore, the method includes forming an optically inactive region, wherein the optically inactive region is arranged alongside the optically active region. Furthermore, the method includes forming an electrically conductive frame having a first frame element 811 and a second frame element 812, which partly surround the optically active region. The electrically conductive frame is formed on the carrier 802. The first electrode 841 is arranged on or above the carrier 802 in such a way that it partly covers the optically active region.

Furthermore, the electrically conductive frame is formed from a transparent conductive oxide.

As shown in FIG. 8A and FIG. 8B, the electrically conductive frame can be formed in an edge region of the carrier 802. By way of example, the first frame element 811 and the second frame element 812 can be formed simultaneously or successively on the carrier. The first frame element 811 and the second frame element can be formed with different or identical layer thicknesses. The electrically conductive frame can be formed in accordance with an embodiment described above. The electrically conductive frame can Forming the electrically conductive frame may include at least one of the following methods: physical vapor deposition, screen printing, inkjet printing, blade coating, spraying, photolithography can a vapor deposition of a TCO. By way of a printing and/or spraying method, thick layers can be deposited particularly rapidly, simply and cost-effectively. By means of a printing and/or spraying method, the electrically conductive frame can be formed particularly rapidly, simply and cost-effectively.

The method may include for example forming an optically functional layer 820, for example illustrated in FIG. 8C. The optically functional layer 820 can be formed in accordance with an above-described embodiment of the optically functional layer 820. The optically functional layer 820 can be formed for example by means of inkjet printing, or some other suitable method.

The method may furthermore include forming a current distribution layer 840. The current distribution layer 840 can be formed in accordance with an embodiment described above. The current distribution layer 840 can be formed as a continuous layer, as shown for example in FIG. 8E, for example by means of one of the methods described above. After the continuous current distribution layer 840 has been formed, the continuous current distribution layer 840 can be subdivided into a first current distribution region 841 and a second current distribution region 842. However, the first current distribution region 841 and the second current distribution region 842 can also be deposited directly on the component 800, for example shown in FIG. 8F, for example by means of a mask process. FIG. 8F illustrates the first current distribution region 841 and the second current distribution region 842 by means of a dashed line.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A component, comprising:
an optically active region, wherein an optical property of the optically active region is electrically controllable; and
an optically inactive region, which is formed alongside the optically active region;
an encapsulation and a carrier;
wherein the optically inactive region and/or the optically active region have/has an adaptation structure designed to adapt a value of an optical variable in the optically inactive region to a value of the optical variable in the optically active region in an optically inactive state of the component; and
wherein the adaptation structure is formed between the carrier and the encapsulation.

2. The component as claimed in claim 1,
wherein the component comprises an electro-optical component or is formed in such a way.

3. The component as claimed in claim 1,
wherein the optically active region and the optically inactive region are formed on the carrier.

4. The component as claimed in claim 1,
wherein the encapsulation is formed in such a way that the optically active region, the optically inactive region and/or the adaptation structure are hermetically sealed with respect to at least water and/or oxygen.

5. The component as claimed in claim 1,
wherein the optically inactive region has an electrically conductive contact structure, wherein the electrically conductive contact structure is designed for forwarding a current for energizing the optically active region.

6. The component as claimed in claim 1,
wherein the optically inactive region is formed in an edge region of the component, and/or wherein the optically inactive region is at least partly surrounded by the optically active region.

7. The component as claimed in claim 1,
wherein the adaptation structure at least partly has the layer structure of the optically active region, of which the optically inactive region is free.

8. The component as claimed in claim 1,
wherein the adaptation structure is formed at least regionally in an electrically insulating fashion or in an electrically insulated fashion.

9. The component as claimed in claim 1,
wherein the adaptation structure is formed at least regionally in an electrically conductive fashion.

10. The component as claimed in claim 9,
wherein the adaptation structure comprises or is formed from indium tin oxide.

11. The component as claimed in claim 1,
wherein the adaptation structure is formed in such a way that the value of the optical variable of the optically active region and the value of the optical variable of the optically inactive region are adapted to a predefined value.

* * * * *